United States Patent [19]
Baba et al.

[11] Patent Number: 5,621,243
[45] Date of Patent: Apr. 15, 1997

[54] SEMICONDUCTOR DEVICE HAVING THERMAL STRESS RESISTANCE STRUCTURE

[75] Inventors: Noboru Baba, Hitachioota; Hisanori Okamura, Tokai-mura; Masahiko Sakamoto, Hitachi; Hirosi Akiyama, Hitachi; Ryuichi Saito, Hitachi; Yoshihiko Koike, Hitachi; Makoto Kitano, Tsuchiura; Sigeki Sekine, Hitachi; Hideya Kokubun, Takahagi; Nobuya Koike, Maebashi, all of Japan

[73] Assignees: Hitachi, Ltd., Tokyo; Hitachi Haramachi Electronics Co., Ltd., Ibaraki, both of Japan

[21] Appl. No.: 363,245

[22] Filed: Dec. 23, 1994

[30] Foreign Application Priority Data

Dec. 28, 1993 [JP] Japan .................................. 5-334908
Jan. 28, 1994 [JP] Japan .................................. 6-008503

[51] Int. Cl.$^6$ ........................... H01L 23/34; H05K 7/20
[52] U.S. Cl. ..................... 257/712; 257/713; 257/717; 351/688; 351/704; 351/707; 351/711
[58] Field of Search ................................ 257/678, 687, 257/690, 691, 698, 704, 706, 708, 709, 712, 713, 714, 717, 720, 723, 734, 762, 763, 764, 770; 361/688, 704, 707, 711, 714, 718, 719, 720; 437/209, 215, 218

[56] References Cited

U.S. PATENT DOCUMENTS 4,558,510  12/1985  Tani et al. ........................... 257/687
5,367,196  11/1994  Mahulikar et al. ................... 257/690

FOREIGN PATENT DOCUMENTS

| | | |
|---|---|---|
| 59-46036 | 3/1984 | Japan . |
| 60-1837 | 1/1985 | Japan . |
| 60-257141 | 12/1985 | Japan . |
| 61-234756 | 10/1986 | Japan . |
| 4-287952 | 10/1992 | Japan . |

*Primary Examiner*—Carl Whitehead, Jr.
*Attorney, Agent, or Firm*—Antonelli, Terry, Stout & Kraus, LLP

[57] ABSTRACT

A high reliability electric power control semiconductor device with a prolonged product lifetime has been provided by successfully suppressing the metal support plate or the metal heat dissipation plate from warping due to the thermal stress during bonding so as to prevent the occurrences of cracks and gaps in the brazing fillers in the bonded layers between the metal heat dissipation plate or the metal support plate and the insulation plate in the semiconductor device comprising the semiconductor elements, metal heat dissipation plate, thermal stress buffer, insulation plate, and the metal support plate, wherein at least one of the metal heat dissipation plate and the metal support plate comprises a copper alloy of which a softening temperature at which a hot hardness of which becomes ½ of the hardness at the room temperature is 350° C. or more. Further, in the semiconductor device fabricated by bonding the semiconductor elements via the thermal stress buffer, the heat dissipation plate and the insulation plate onto the metal support plate, the heat dissipation plate comprises a portion having a reduced thickness in the periphery thereof machined by counterboring or the like.

32 Claims, 22 Drawing Sheets

SHEAR STRENGTH OF Sn-Pb SOLDER LAYER AFTER HEAT CYCLE TEST
UNDER HEAT CYCLE CONDITION : 0~150°C, 100 CYCLES dX₁ (DEFORMATION AMOUNT)

dX₂ (DEFORMATION AMOUNT (AT MODULE ASSEMBLY))

SEMICONDUCTOR DEVICE HAVING THERMAL STRESS RESISTANCE STRUCTURE

BACKGROUND OF THE INVENTION

The present invention relates to a semiconductor device, and in particular, it relates to a semiconductor device which has a plurality of power semiconductor elements such as insulated gate bipolar transistors (IGBT) arrayed and integrated into a module.

Recently, the high-speed switching pulse width modulation control (PWM) method has become a mainstream in the electric power control equipment for controlling electric power supply. As its control elements, bipolar transistors, field effect transistors (FET), IGBT are utilized. Among them, IGBT devices have been widely applied for their excellent efficiencies from industrial applications such as elevators, trains, machine tools, uninterruptible power supplies to home appliances such as air-conditioners, electric ovens, and so on.

These electric power control devices which are increasingly required to control higher voltages and currents to comply with a need for faster operation and greater output tend to increase heat generation in their semiconductor devices. Thereby, it has become most important for them to be able to dissipate the heat generated in the semiconductor devices. As the structure of their semiconductor devices, there is known such a structure in which an insulation plate, a metal heat dissipation plate, a thermal stress relieving material and a semiconductor device are bonded sequentially using a brazing material such as solder or the like on a metal support plate. The thermal stress relieving material is utilized to prevent the semiconductor device from cracking due to a thermal stress resulting from a difference between a thermal expansion coefficient of approximately $4.5 \times 10^{-6}/°$ C. for Si which constitutes the semiconductor device and a thermal expansion coefficient of approximately $17 \times 10^{-6}/°$ C. for Cu which constitutes the metal heat dissipation plate. Since the heat dissipation plate must have a large thermal conductivity to ensure an improved heat dissipation and a good electric conductivity for serving as an electrode for the semiconductor device as well, Cu is generally used for it. The insulation plate is necessary for electrically insulating from the metal support plate. $Al_2O_3$ ceramics is most widely utilized as its substrate because of its excellent electric properties in withstand voltage and resistivity, and of its mechanical strength and manufacturing cost as well. For the metal support plate since it contributes much to the heat dissipation thereby it must have a greater thermal conductivity, Cu is preferably utilized. Any electric power supply control equipment having the above-mentioned construction undergoes repetition of exothermic and cooling cycles while repeating start and stop of operation. Thereby, a thermal stress due to a difference between thermal expansion coefficients is exerted on the brazing materials which bond the metal dissipation plate, the metal support plate and the insulation plate so as to cause a crack or a gap to occur therebetween. In order to solve such problems associated with the prior art, the Japanese Patent Application Laid-Open No.5-136286 discloses as shown in FIG. 4 that the mesh member 18 having the thermal expansion coefficient which is adapted to be intermediate between those of the heat dissipation plate 3 and the insulation plate 2 is inserted therebetween to reinforce the soldering layer by forming a uniform thickness soldering layer, thereby to prevent the occurrence of cracks and gaps due to the thermal stress as described above. Further, the Japanese Patent Application Laid-Open No.4-287952 discloses as shown in FIG. 5 that the thermal stress relieving materials 20, 23 including Mo or the like are provided in the bonding portion between the insulation plate and the metal dissipation plate to prevent the occurrence of the cracks and gaps due to the aforementioned thermal stresses.

Further, the Japanese Patent Application Laid-Open No.61-237456 discloses that each linear expansion coefficient and each longitudinal elasticity coefficient of each structural member to be utilized in the module are specified to minimize the stress. On the other hand, as some optimization methods for optimizing the thickness of each plate member to be utilized in the module, there is known such one as disclosed, for example, in the Japanese Patent Application Laid-Open No.59-46036 in which the thickness of the insulation plate used in the module is defined to be 0.15–0.35 mm to improve the heat dissipation capability and the heat cycle resistance of the module. Further, the Japanese Patent Application Laid-Open No.60-257141 discloses that the insulation plate, the terminal plate, the stress relieving plate and the semiconductor chip are mounted on the metal base sequentially in lamination by means of soldering wherein the thickness of the stress relieving plate is adapted to become thicker than that of the terminal plate to reduce the stress exerting on the soldering. The Japanese Patent Application Laid-Open No.60-1837 discloses that the metal support on which the semiconductor chip is to be soldered is provided with protrusions which serves to define a thickness of the solder filler material and prevent the transversal shifting of the semiconductor chip so as to provide precision soldering in thickness and position.

In the foregoing method for reinforcing the solder layer by providing the uniform thickness soldering layer by inserting the metal mesh member, although many of the above-mentioned problems has been solved, there still remains crucial problems to be solved since the occurrence of cracks has been recognized when they are applied in practice, thus this method has provided only a partial solution but not an adequate solution. Further, the method which uses a thermal stress relieving member such as Mo or the like in the bonding portion between the insulation plate and the metal heat dissipation plate is associated with such problems that the manufacturing cost increases due to an increased number of bonded members and that the defect occurrence ratio increases with the increased number of bonded members, thereby, failing actually to solve the problems.

Further, even arranging such that the linear expansion coefficients and longitudinal elasticity coefficients of respective members used inside the module are specified to minimize the stresses exerting on the solders, since in an actual module the dimensions of plates being laminated from the semiconductor chip toward its supporting substrate are caused to change, the plate members which apply stresses on the soldering layers differ from between portions at their locations immediately below the semiconductor chip and to the other locations. Further, since the stresses applied on the soldering fillers become a maximum in the peripheral portion, and from which a crack in the solder initiates and propagates, it becomes important to balance the stress immediately below the chip and the stress in the peripheral portion.

Therefore, it is necessary to examine an optimum thickness for each component of the structure depending on its lamination structure. However, in the foregoing prior art, the plate thickness of each layer construction is specified identical on the same plane, thus, there has been no attempt to optimize individual lamination structures.

In the Japanese Patent Application Laid-Open No.59-46036, however, there has been discussed partially on the warp which occurs in the bonded members due to a difference in their thermal expansion coefficients, and there has been employed a method for reducing the stress exerting on the soldering layer as well as lowering the warp amount in the bonded lamination members.

However, this prior art has not taken into account such cases where bonding process is repeated plural times, and a warp formed in a composite material which was bonded precedently will alter the behavior thereof in a subsequent bonding process thereby decreasing the bonding strength of the solder.

SUMMARY OF THE INVENTION

The main object of the invention is to solve the problems associated with the occurrence of cracking and gaps due to thermal stress in the aforementioned bonded members, and provide a semiconductor device for use in the electric power supply control having an improved lifetime and reliability.

In order to accomplish the foregoing object of the invention, the present invention has contemplated a semiconductor device which is arranged by sequentially mounting on a metal support plate an insulation substrate, a metal heat dissipation plate, a plurality of thermal stress relieving material mounted on the foregoing metal heat dissipation plate, and semiconductor elements, on the foregoing thermal stress relieving material, wherein the foregoing metal heat dissipation plate comprises a Cu-based alloy of which a softening temperature at which its hot hardness becomes ½ of a hardness at room temperatures is greater than a highest bonding temperature among the bonding temperatures of the foregoing insulation substrate, the metal heat dissipation plate, the thermal stress relieving material and the semiconductor element.

Further, in the semiconductor device having the foregoing arrangement, the foregoing metal support plate comprises a Cu-based alloy of which a softening temperature at which its hot hardness becomes ½ of the hardness at the room temperatures is greater than a bonding temperature for bonding with the aforementioned metal heat dissipation plate, and of which a thermal conductivity at room temperature is 320 J/sec.m.K or more, or of which an electric conductivity (IACS) at room temperature is 50% or more.

Still further, in the semiconductor device having the foregoing arrangement, the aforementioned metal heat dissipation plate comprises a Cu-based alloy of which a softening temperature at which its hot hardness becomes ½ of a hardness thereof at room temperature is greater than a bonding temperature required for bonding with the foregoing thermal stress relieving material, and of which a thermal conductivity at room temperatures is 320 J/sec.m.K or more, or of which an electric conductivity (IACS) is 50% or more.

Furthermore, in the semiconductor device having the foregoing arrangement, at least one of the foregoing members of the metal heat dissipation plate and the metal support plate comprises a Cu-based alloy of which the thermal conductivity at room temperatures is 320 J/sec.m.K or more, or of which the electric conductivity (IACS) at room temperatures is 50% or more, and of which an elastic constant at room temperatures is 130 GPa or more.

Further, in the semiconductor device having the foregoing arrangement, at least one of the foregoing members of the metal heat dissipation plate and the metal support plate comprises a metal component of which the softening temperature at which a hot hardness thereof becomes ½ of the hardness thereof at room temperatures is greater than a maximum bonding temperature among the bonding temperatures required for bonding the aforementioned insulation substrate, the metal heat dissipation plate, the thermal stress relieving plate, and the semiconductor element, and of which the thermal conductivity at room temperatures is 320 J/sec.m.K or more, or of which the electric conductivity (IACS) at room temperatures is 50% or more, and of which the elastic constant at room temperatures is 130 GPa or more.

Still more, in the semiconductor device having the foregoing arrangement, at least one of the foregoing members of the metal heat dissipation plate and the metal support plate comprises a Cu-based alloy including at least one of Cr, Zr, Ti, Be, Sn, Ag, and Cd, of which the softening temperature at which a hot hardness thereof becomes ½ of a hardness thereof at the room temperature is greater than 350° C., and of which the thermal conductivity at room temperatures is 320 J/sec.m.K or more, or of which the electric conductivity (IACS) at room temperatures is more than 50%.

In the semiconductor device having the foregoing arrangement, at least one of the foregoing members of the metal heat dissipation plate and the metal support plate comprises a Cu-based alloy which contains besides Cu another metal element which exceeds a solid solution limit relative to said Cu, wherein said alloy is subjected to age hardening treatment, of which the softening temperature at which the hot hardness thereof becomes ½ the hardness thereof at room temperatures is 350° C. or more, and of which the thermal conductivity is 320 J/sec.m.K or more, or of which the electric conductivity (IACS) is 50% or more.

In the foregoing arrangement of the semiconductor device according to the invention, at least one of the members of the metal heat dissipation plate and the metal support plate comprises a Cu-based alloy which contains 98.7% or more of Cu by weight percent and the remaining percent of one or more of the elements selected from the group consisting of Cr, Zr, Ag and Sn, and of which the softening temperature at which the hot hardness thereof becomes ½ of the hardness thereof at room temperatures is 350° C. or more.

Still more, in the foregoing semiconductor arrangement, at least one of the members of the foregoing metal heat dissipation plate and the metal support plate comprises a Cu-based alloy which contains 98.7% or more of Cu by weight percent and the remaining percent of one or more of elements selected from the group consisting of Cr, Zr, Ag and Sn, and of which the thermal conductivity at room temperatures is 320 J/sec.m.K or more, or of which the electric conductivity (IACS) at room temperatures is 50% or more.

Further, in a semiconductor device having the metal support plate, an insulation substrate having Cu foils both on its upper and bottom surfaces and mounted on the metal support plate, and a plurality of semiconductor elements, wherein the metal support plate comprises a material of which a softening temperature at which a hot hardness thereof becomes ½ of a hardness thereof at room temperatures is higher than a bonding temperature required for bonding said metal support plate, and of which a thermal conductivity at room temperatures is 320 J/sec.m.K or more, or of which an electric conductivity at room temperatures is greater than 50% in terms of IACS.

Still further, in the semiconductor device having the metal support, the insulation substrate having Cu foils both on its upper and bottom surfaces and mounted on the metal support plate, and a plurality of semiconductor elements, wherein the material of said metal support plate comprises a Cu-based alloy containing 98.7 weight percent or more of Cu and the remaining weight percent of another one or more elements selected from the group of Cr, Zr, Ag and Sn, said another one or more elements being included within a range of 1.1% singly or in total, and of which the thermal conductivity at room temperatures is 320 J/sec.m.K or more, or of which the electric conductivity at room temperatures is greater than 50% in terms of IACS.

Still more, in the semiconductor device sequentially mounting on the metal support plate the insulation substrate, the metal heat dissipation plate, a plurality of thermal stress relieving material on said metal heat dissipation plate, and a corresponding number of semiconductor elements as the plurality of thermal stress relieving material, at least one of the metal heat dissipation plate and the metal support plate comprises a Cu-based alloy of which the softening temperature at which a hot hardness thereof becomes ½ of a hardness thereof at room temperatures is 350° C. or more, and of which a thermal conductivity at room temperatures is 320 J/sec.m.K or more, or of which an electric conductivity at room temperatures is greater than 50% in terms of IACS. Further, a bonding layer between said insulation plate and the metal heat dissipation plate or the metal support plate comprises a mesh or a sheet formed in mesh disposed therebetween of which the thermal expansion coefficient has an intermediate value of those of respective component materials.

Further, preferably the aforementioned thermal stress relieving material inserted between the semiconductor element and the heat dissipation plate is selected from Mo, W, Ta and its alloy.

Preferably, the aforementioned insulation substrate is selected from $Al_2O_3$, AlN and SiC.

Further, in order to accomplish the aforementioned object of the invention, a semiconductor device which is internally isolated by bonding semiconductor elements on an electrically conductive support substrate via a plurality of electrically conductive plates including an insulation plate each having a dimension which varies sequentially using metal brazing filler is provided, wherein at least one of the plurality of electrically conductive plates and the electrically conductive support substrate comprises a peripheral portion on its bonding surface facing a smaller dimension plate, which is at least partially formed to have a reduced plate thickness in comparison with that of its central portion.

In the foregoing semiconductor device, the forming method is preferably done by one of the processes of counterboring, groove-cutting and slit-cutting.

In addition, in the foregoing fabrication, said forming processes may include oblique cutting to form a curved surface or a plane.

Further, according to the invention, an internally insulated semiconductor device is provided by mounting sequentially in lamination on a support substrate made of Cu or a Cu-based alloy at least one semiconductor element via a thermal stress relieving plate made of Mo, W, Ta or its alloy which is disposed corresponding to the at least one semiconductor element, a heat dissipation plate including Cu or a Cu-alloy and an insulation substrate made of $Al_2O_3$, AlN or SiC, wherein said heat dissipation plate comprises a peripheral portion the thickness of which is reduced by machining with respect to the center portion thereof.

In addition, in the above-mentioned semiconductor device, the peripheral shape of the plate of which the thickness is reduced may be machined by oblique cutting to a curved surface or a plane.

Furthermore, according to the invention, there is provided an internally insulated semiconductor device which mounts sequentially in lamination on a support substrate made of Cu or a Cu-based alloy at least one semiconductor element via a thermal stress relieving plate made of Mo, W, Ta or its alloy which is disposed corresponding to the at least one semiconductor element, a heat dissipation plate including Cu or a Cu-alloy and an insulation substrate made of $Al_2O_3$, AlN or SiC, wherein said heat dissipation plate on which said thermal stress relieving plate is lamination-bonded comprises a portion in the periphery thereof the thickness of which is reduced.

In the above-mentioned semiconductor device, the portion formed in the heat dissipation plate of which the thickness is reduced is preferably machined by at least one of the oblique cutting, groove-cutting and counterboring.

Still further, according to the invention, an internally insulated semiconductor device is provided by mounting sequentially in lamination on a support substrate made of Cu or a Cu-based alloy, at least one semiconductor element via a thermal stress relieving plate made of Mo, W, Ta or its alloy which is disposed corresponding to the at least one semiconductor element, a heat dissipation plate made of Cu or a Cu-alloy and an insulation substrate made of $Al_2O_3$, AlN or SiC, wherein at least one of said heat dissipation plate and said support substrate has, on one surface thereof where it bonds with said insulation substrate, a plurality of protrusions having a predetermined height and size.

Further, utilizing the metal support plate and the metal heat dissipation plate according to the invention described above, and bonding in lamination the insulation substrate, the metal heat dissipation plate, the thermal stress relieving material and semiconductor elements using solder there is provided a semiconductor device, wherein when a composite member is formed by bonding said semiconductor element, said thermal stress relieving material and said metal dissipation plate, a warp resulting in said metal heat dissipation plate is machined to provide a flat surface thereon for facilitating bonding with said insulation substrate and said metal support plate.

Utilizing the metal support plate and the metal heat dissipation plate described above, and bonding in lamination the insulation substrate, the metal heat dissipation plate, the thermal stress relieving material and the semiconductor element using brazing filler, there is provided a semiconductor device wherein said metal heat dissipation plate comprises a groove formed at least in one of its surfaces abutting said thermal stress relieving material or said insulation substrate.

Further, in the semiconductor device fabricated by utilizing the metal support plate and the metal heat dissipation plate described above, and bonding in lamination the insulation substrate, the metal heat dissipation plate, the thermal stress relieving material and the semiconductor element using brazing filler, it is preferable for said heat dissipation plate to be tapered at its end.

Still further, in a semiconductor device having the above-mentioned structure, it is preferable to use as its semiconductor element at least one selected from the group of insulated gate bipolar transistors (IGBT), diodes and thyristors.

Advantageously, the above-mentioned semiconductor device can be applied to the electric power supply control equipment.

Advantageously, the above-mentioned electric power supply control equipment can be mounted on any one of trains, elevator control equipment and machine tools.

Furthermore, as to the metal support plate for mounting the semiconductor element according to the invention, it comprises a Cu-based alloy of which the softening temperature at which the hot hardness thereof becomes ½ of the hardness thereof at room temperatures is 350° C. or more, and of which the thermal conductivity at room temperatures is 320 J/sec.m.K or more, or of which the electric conductivity is 50% or more in terms of IACS.

Further, the metal heat dissipation plate for mounting the semiconductor element comprises a Cu-based alloy of which the softening temperature at which the hot hardness thereof becomes ½ of the hardness thereof at room temperatures is 350° C. or more, and of which the thermal conductivity at room temperatures is 320 J/sec.m.K or more, or of which the electric conductivity is 50% or more in terms of IACS.

Still further, for accomplishing the aforementioned object of the invention, there is conceived a method for manufacturing a metal support plate for mounting the semiconductor element wherein the method for manufacturing the metal support plate comprises the steps of subjecting a Cu-based alloy which contains a small quantity of one or more of Cr, Zr, Ti, Be, Sn, Ag and Cd to a solution treatment, then, to an ageing treatment.

In a method for manufacturing the semiconductor device according to the invention whereby the insulation substrate, the metal heat dissipation plate, a plurality of thermal stress relieving materials disposed on the foregoing heat dissipation plate, and the same number of semiconductor elements as the plurality of the thermal stress relieving materials are mounted in lamination on the metal support plate, the same method further comprises the steps of bonding a plurality of said thermal stress relieving material on said metal heat dissipation plate, then, bonding said semiconductor elements to each one of said plurality of thermal stress relieving materials, then, bonding simultaneously said insulation substrate and said metal support plate to said metal heat dissipation plate.

Further, in the method for manufacturing the semiconductor device whereby the insulation substrate, the metal heat dissipation plate, the plurality of thermal stress relieving material disposed on the foregoing metal heat dissipation plate, and the same number of semiconductor elements as the plurality of the thermal stress relieving materials are mounted in lamination on the metal support plate, the same method comprises the step of utilizing appropriate brazing fillers for bonding therebetween each having a melting point at a decreasing temperature in the order of bonding procedures.

In the case when mounting on the metal support plate sequentially in lamination the insulation substrate, metal heat dissipation plate, the plurality of thermal stress relieving materials and the same number of semiconductor elements as the thermal stress relieving materials, since along with a need for an increasing capacity of today's electric power supply control equipment, it has resulted in that the number of semiconductor elements has increased with associated components becoming larger in size such that the metal support plate is required to have a size of 90 mm square or more, and the metal heat dissipation plate to have a size of 45 mm square or more. Therefore, it is becoming more difficult to bond them in lamination in one single process. It is because that in order to ensure an appropriate bonding strength in each bonding layer between respective members, it is required for each bonding layer to have a thickness set at a predetermined value or more. When the thickness of the bonded layer is not evenly distributed, a crack or a gap is likely to initiate from a thinner portion in the bonded layer. Therefore, bonding between respective members is performed hierarchically in such a manner that respective substrates are set consecutively to respective jigs so that each brazing layer can be controlled to have an appropriate thickness. Thereby, in the manufacture of the aforementioned semiconductor device, it was necessary to employ such a process comprising the steps of bonding a thermal stress relieving material such as Mo or the like to the metal heat dissipation plate using a brazing filler such as Au—Sn solder which has a highest melting temperature and bonds at 340° C. or a 72 weight-percent Ag—Cu brazing filler which bonds at 810° C., bonding semiconductor elements and the thermal stress relieving materials using a brazing filler such as Sn—Sb solder which melts at 270° C., and finally bonding between the metal heat dissipation plate on which both the semiconductor elements as well as the thermal stress relieving materials have been bonded, the insulation plate, and the metal support plate using a lowest temperature brazing filler such as Pb—Sn solder which bonds at around 240° C. In the case where a prior art brazing filler such as Pb—Sn solder which melts at low temperatures was used alone for once bonding, for example, of pure copper of which the softening temperature of the hot hardness at high temperatures thereof is in a range 200°–300° C. (where the softening temperature is defined at which its hot hardness becomes ½ of the hardness at room temperatures), since a required bonding temperature is still below 250° C., there occurred no substantial warp that would cause a major problem. However, in the aforementioned case where the brazing filler material having a high temperature melting point is used, a large thermal stress distortion occurs in the metal heat dissipation plate at the time of bonding, thereby causing the metal heat dissipation plate to warp significantly after cooling. It is because that a required bonding temperature becomes higher than the softening point of pure copper thus causing its material to soften during bonding, thereby lowering the hardness and stiffness of its material, and thereby resulting in a large amount of warp. In view of such disadvantages associated with the prior art and to solve this problem, the present invention contemplated successfully to utilize a Cu-based alloy having a softening temperature higher than its bonding temperature for the metal heat dissipation plate and the metal support metal so as to prevent lowering of hardness and stiffness due to softening of its material, and minimize its warp amount.

With reference to FIG. 6 there is shown a relationship of hardness of various Cu alloys relative to various testing temperatures. The measurement of hot hardness of a test specimen is normally conducted after increasing the temperature of the test specimen to a predetermined temperature at a rate of several tens degree centigrade per minute, and holding for about 5 minutes until the temperature in the specimen becomes uniform. For pure Cu, at around 280° C. its hot hardness drops from approximately 110 HV available at room temperatures to about 55 HV which is half thereof. Respective softening temperatures of respective Cu-based alloys as learned from FIG. 6 are listed in Table 1.

TABLE 1

| MATERIAL | COMPOSITION | SOFTENING TEMPERATURE (°C.) |
|---|---|---|
| Cu | Cu 99.96% and above | 280 |
| Cu—Ag | Cu—0.2%Ag | 380 |
| Cu—Cd | Cu—0.87%Cd | 380 |
| Cu—Zr | Cu—0.15%Zr | 580 |
| Cu—Cr | Cu—1.17%Cr | 530 |
| Cu—Zr—Cr | Cu—0.1%Zr—1.0%Cr | 580 |

Of any metals other than those shown in FIG. 6 can be determined its softening temperature likewise. The softening temperature varies depending on purity of its material and a method of heat treatment. For example, a pure copper with a purity 99.96% or more has a softening point at 200° C., and a phosphor desulfurized copper with a purity 99.90% or more containing 0.015–0.040 weight percent phosphor has a softening point at 320° C. Since a maximum bonding temperature required for bonding the semiconductor substrate according to the invention is 340° C., it is preferable for the metal heat dissipation plate or the metal support plate for use in the aforementioned semiconductor device to be a Cu-based alloy having a softening temperature substantially higher than 340° C. In the drawing of FIG. 6, Cu—Ag, Cu—Cd, Cu—Zr, Cu—Cr and Cu—Zr—Cr are acceptable, of which Cu—Zr and Cu—Zr—Cr indicating higher softening temperatures are more preferable. However, simply that it has a high softening temperature can not qualify for application to the metal heat dissipation plate or the metal support plate. What is required as most crucial to the metal heat dissipation plate and metal support plate is heat dissipation capability to efficiently dissipate the heat generated in the semiconductor elements. It is required for them to have a thermal conductivity, which is an index of heat dissipation capability, of 320 J/sec.m.K or more. When any material of which the thermal conductivity is smaller is utilized, the temperature of semiconductor elements may rise during operation causing its electrical properties to deteriorate, and resulting in an increased thermal stress leading to a crack generation. The greater the thermal conductivity, the more advantageous it is for the heat dissipation. However, it is determined through experiments that a thermal conductivity over 320 J/sec.m.K may be adequate in practice. In addition, since the metal heat dissipation plate must serve also as an electrode, its electric conductivity should preferably be as great as possible. If its electric resistance is great, a loss in electric energy causes an exothermic reaction which causes the semiconductor device further to increase its temperature. It is determined through experiments that an electric conductivity over 50% in terms of IACS is required in comparison with pure Cu the electric conductivity of which is assumed to be 100. In cases of metals, since transfer medium in respect of both the thermal conductivity and the electric conductivity is electron, a material that has a large thermal conductivity has a large electric conductivity as well. Therefore, any Cu-based alloy will suffice the requirements if it satisfies either one of the conditions that its thermal conductivity is 320 J/sec.m.K or more and its electric conductivity is over 50% in terms of IACS, and further that its softening temperature exceeds its bonding temperature. In order to prevent decreasing of the thermal conductivity and electric conductivity, it is required that an addition of any alloy elements is preferably limited to below a predetermined amount. To be noted in respect of metallic materials, there exists an annealing temperature similar to the softening temperature as prescribed in this invention. This refers to a temperature of a heat treatment which causes a metallic material after it is heat-treated at this temperature for a predetermined period of time to drop its hardness abruptly at room temperatures, thus, it is different from the softening temperature of the invention. According to the result of experiments by the present inventors and others, the annealing temperature is normally higher than the softening temperature by approximately 100° C.

Further, the metallic heat dissipation plate or the metallic support plate is not limited to Cu alloys, and may be any material provided that it satisfies either one of the following conditions that its softening temperature exceeds its bonding temperature and its thermal conductivity is over 320 J/sec.m.K, or that its electric conductivity exceeds 50% in respect of IACS, and further if it has an elastic constant of 130 GPa or more. Any material having a smaller elastic constant, even if its softening temperature is above its bonding temperature, is not suitable because of its large amount of warp to be anticipated to result in at the time of bonding. The conditions required in respect of heat dissipation capability and thermal conductivity are the same as those of Cu-alloys.

The material of the metallic heat dissipation plate or the metallic support plate may be any Cu-based alloy that comprises Cu as its main component and at least one of Cr, Zr, Ti, Be, Sn, Ag and Cd, within a range that its softening temperature at high temperatures at which its hot hardness drops to ½ of the hardness at room temperatures is 350° C. or more, and which satisfies either one of the conditions that its thermal conductivity is over 320 J/sec.m.K, and its electric conductivity is over 50% in respect of IACS. Since the bonding temperature required for bonding the semiconductor substrate for implementing the present invention is 340° C. at maximum, the softening temperature is prescribed to be above 350° C. in anticipation of precision in the temperature control. These materials are preferably heat-treated as required. A preferred heat-treatment includes a solution treatment for uniformly dispersing a solid solution of Cr, Zr, Ti, Be, Ag, and Cd element throughout a Cu-matrix, followed by an ageing treatment for uniformly precipitating the aforementioned element in the matrix. The solution treatment is performed by holding for over 1 hour preferably at a temperature lower by approximately 50° C. than the melting point of Cu, and the ageing treatment is performed preferably at approximately 500° C. for several hours. Through this heat treatment, an improved mechanical strength as well as an improved electric conductivity have been achieved. Since elements of Cr, Zr, Ti, Be, Sn, Ag and Cd are caused to precipitate in Cu thereby improving its softening temperature, a Cu alloy having a softening temperature over 350° C. is obtained. However, it is necessary to limit amounts of addition of these elements to minimum in order to meet the prerequisite conditions that the thermal conductivity be higher than 320 J/sec.m.K, or that the electric conductivity be higher than 50% in terms of IACS, since greater amounts of addition thereof will cause exponential decreases of the thermal conductivity and the electric conductivity as well.

Further, preferably, the metallic heat dissipation plate or the metallic support plate according to the invention comprises a Cu-based alloy including Cu as its main component within an extent such that its softening temperature for causing its hot hardness to become one half of the hardness at room temperatures is over 350° C., and another metallic element in an amount exceeding a solid solution limit with respect to the Cu, wherein, the aforementioned alloy is subjected to an age hardening treatment, and its thermal conductivity is over 320 J/sec.m.K, or its electric conductivity is over 50% in terms of IACS. An alloy element to be added is selected from the group of elements which exhibit a remarkable precipitation hardening effect due to the heat treatments in the aforementioned solution treatment and the ageing treatment thereby can improve the strength as well as improve its electric conductivity. Such elements as Ni that produces a continuous solid solution when added to Cu, or Zn that produces a brass alloy are not suitable for attaining the object of the invention since the precipitation hardening effect can not be expected. In the preceding case according to the invention, however, in order to satisfy the prerequisite conditions for the thermal conductivity to be over 320 J/sec.m.K, or the electric conductivity to be over 50% in IACS, it is necessary to limit amount of addition to minimum. As known elements for producing age hardening alloys there are Ag, Mg, La, Pr, Th, Zr, Be, Ti and the like. In particular, an Cu alloy with Be addition demonstrates the most excellent mechanical property as an ageing alloy among many other Cu alloys. Alloys containing Cu-0.25 to 0.5 weight percent Be-1.4 to 1.6 weight percent Ni, Cu-0.4 to 0.7 weight percent Be-2.35 to 2.7 weight percent Co, Cu-1.0 to 1.2 weight percent Be-0.4 to 0.7 weight percent Sn-1.5 to 2.25 weight percent Zn, Cu-1.6 to 1.8 weight percent Be-0.2 to 0.6 weight percent Ni are preferably subjected to a solution treatment at temperatures 700° to 980° C. for 1 to 3 hours, followed by an ageing treatment at 300° to 480° C. for 2 to 5 hours so as to maximize their elastic constants and electric conductivities. In order to improve their mechanical property as described above, it is oftentimes preferable to add not a single element but add plural elements. Thus, it is desirable upon satisfying the prerequisite conditions that the thermal conductivity be over 320 J/sec.m.K, or that the electric conductivity be over 50% in IACS, to compose its alloy such that an excellent elastic constant and an excellent softening temperature as high as possible can be attained.

Further, for a metallic heat dissipation plate or a metallic support plate according to the invention, it is preferable to contain 98.7 weight percent or more of Cu, and the remaining portion of at least one element selected from Cr, Zr, Ag and Sn. Elements such as Cr, Zr, Ag and Sn exhibit a significant precipitation hardening action when added to Cu, thereby, a small amount of addition thereof will effect substantial improvements in the mechanical strength and electric conductivity. The reason for limiting its addition to 1.3 weight percent is for ensuring an electric conductivity over 50% in IACS. The electric conductivity depends greatly on an amount of its addition or a type of its element other than Cu. In particular, such an element that causes a substitution solid solution in the crystal lattice of Cu will drop the electric conductivity. With reference to FIG. 7 there is shown an example of a relationship of electric conductivity in IACS relative to amounts of Cu contained. In this case, Sn is added as another element other than Cu. Since Sn yields a substitution solid solution within the crystal lattice of Cu, it is a type of element which causes the electric conductivity to drop significantly. It is obvious from the drawing of FIG. 7 that in order to have an electric conductivity exceeding 50% in IACS an amount to be added of an element other than Cu must be less than approximately 1.3%. However, this has been the case obtained by adding Sn alone, thus, there may still exist a possibility for its amount of addition to vary depending on a type of elements to be added. In such an instance, however, the same condition will hold that its electric conductivity is subject to an exponential change in a range from 97 to 100% of Cu contents. Thereby, it is advantageous to add such an element that ensures for the electric conductivity a highest softening temperature in the range exceeding 50% in IACS. In addition, it is preferable for an amount of any one of respective addition elements to be within 1.1% in order to provide a significant precipitation hardening effect. In particular, such alloys containing, in weight percent, Cu-0.5 to 1.5% Cr-0.05 to 0.3% Zr; Cu-0.5 to 1.5% Cr; or Cu-0.05 to 0.3% Zr; and further containing 0.1% or less of Ti, which are adapted to have a softening temperature over 500° C. and an elastic constant over 140 MPa at room temperatures, are most suitable for use as the metallic heat dissipation plate or the metallic support plate of the invention.

An increased reliability is required for today's semiconductor devices, and a semiconductor substrate has been proposed having such an arrangement as shown in FIG. 15 which is devoid of the metallic heat dissipation plate and the thermal stress relieving material, but comprises a structure having a Cu foil of electrode on both surfaces of its insulation substrate, and a semiconductor element directly bonded to one of the surfaces. In this instance, while its reliability improves accordingly as the number of bonded layers is reduced from 4 to 2, on the other hand a thermal stress exerting on the bonded layer between its insulation substrate and its metallic support plate will increase greater compared to the prior art structure. Thus, by utilizing the metallic support plate according to the present invention, it can be expected further to improve the reliability of the semiconductor device. By way of example, in this instance, since the metallic support plate is adapted to serve as a heat dissipation plate as well, its insulation plate is preferably comprised of AlN or SiC which has a high thermal conductivity to enable an efficient dissipation of heat generated by semiconductor elements.

Further, by using a method which disposes a mesh or plate in mesh form (which may be in a square frame) having an intermediate value among thermal expansion coefficients of respective component members into the bonded layer between the metallic heat dissipation plate and the insulation substrate or the metallic support plate, as well as employing in combination the metallic heat dissipation plate or the metallic support plate described above comprising the Cu alloy which satisfies the prerequisite conditions that its softening temperature is over 350° C., and its thermal conductivity is over 320 J/sec.m.K, or that its electric conductivity is over 50% in IACS, it becomes possible to provide a uniform thickness to the brazing layer and minimize the warp on the substrate due to thermal stress, which in combination produce a synergistic effect further to restrain the occurrences of a crack and a gap in the brazing material.

Further, in respect of the thermal expansion coefficient, it is advantageous for the thermal stress relieving material to be selected from Mo, W and Ta, or from its alloys. It is further advantageous for a thermal expansion coefficient of said thermal stress relieving material to be in the vicinity of $4.5 \times 10^{-6}/°$ C. which is the thermal expansion coefficient of Si.

Also, it is more advantageous for the insulation substrate to have a greater thermal conductivity and a thermal expansion coefficient of which the value is approximately intermediate between those of Cu and the semiconductor element. As such that satisfies the aforementioned condition, it is preferable to be selected from $Al_2O_3$, AlN and SiC.

Further, through combined uses of any one of the aforementioned Cu alloys and a method for bonding the metallic heat dissipation plate with the insulation plate and the metallic support plate after machining the opposite surface (on which no thermal stress relieving material is bonded) of the metallic heat dissipation plate where a warp has occurred due to bonding of the thermal stress relieving material so as to provide a flat surface suitable for bonding with the insulation plate and the metallic support plate, it becomes possible effectively to suppress the occurrence of cracks and gaps in the brazing filler material between the metallic heat dissipation plate and the insulation plate during operation.

Still further, by providing a groove in the surface of the metallic heat dissipation plate on the side where the semiconductor elements are mounted, the same thermal stress relieving effect as above can be attained.

In addition, it is effective for minimizing stress concentration on an edge portion of bonding to provide tapering on the metallic heat dissipation plate such that a surface thereof which does not carry the semiconductor elements is adapted to have a larger area than that of a surface thereof on which the semiconductor elements are directly mounted.

In a semiconductor device with an internal insulation for isolating a semiconductor element from an electrically conductive support substrate by bonding the semiconductor element to the electrically conductive support substrate via a plurality of electrically conductive plates and an insulation plate each having a different size using metallic brazing fillers, at least one of the foregoing plurality of electrically conductive plates and the metallic support substrate is fabricated to have a portion which has a reduced thickness compared to its thickness at the center thereof at least partially in the periphery of the surface where it is bonded to another plate which is smaller in size than itself, whereby since the portion which has the reduced thickness will serve to relieve a stress in the periphery of each bonded portion of each lamination member, it becomes possible to minimize the stresses exerting on the metallic brazing fillers, suppress a crack propagation from the vicinity of the metallic brazing fillers, and thereby prolong the service life of the semiconductor module.

Further, by fabricating the opposite surface of the heat dissipation plate to have a flat surface or a convex surface, a thermal deformation resulting from a subsequent lamination bonding process can appear to cancel a residual stress in the periphery of the bonded portion. As a result, since the stress exerting on the metallic brazing material can be minimized and the crack propagation from the vicinity of the metallic brazing filler can be suppressed, it is possible to prolong the service life of the module.

As a result of this thermal deformation, since the metallic brazing filler is forced to expand from the center toward its periphery, void is suppressed to be trapped inside the brazing filler. Thereby, there occurs no increase in heat resistance, thus improving its heat dissipation effect, consequently prolonging the service life of the module in this respect as well.

Further, since protrusions provided on the heat dissipation plate or on the module support substrate are adapted to act to define an appropriate thickness for the metallic brazing filler at the time of bonding process, any irregular distribution of a film thickness of the brazing filler can be prevented from taking place, as a result, an increase in the stress due to a reduced thickness of the metallic brazing filler can be prevented, thus ensuring a stable operation with a prolonged service life of the module.

The semiconductor elements for use in the aforementioned semiconductor device, which may be comprised of a semiconductor element having a switching function such as an IGBT element, a bipolar transistor, an FET, a diode and a thyristor, will be able to carry out an electric power supply control by PWM.

Even if a heat cycle increases due to a repeated start and stop operation, electric power supply control equipment utilizing the aforementioned semiconductor device can substantially improve its reliability since a thermal deterioration of the semiconductor elements and a crack occurrence have been successfully suppressed. Thereby, trains, passenger vehicles including electric cars or the like, elevator controllers, machine tools which have incorporated the aforementioned electric power supply control equipment can exhibit a stable performance. In addition, any other equipment such as electric motors, oscillators, heaters and the like that require a reliable electric power supply control can advantageously employ the semiconductor equipment of the invention to improve the reliability of its equipment.

BRIEF DESCRIPTION OF THE DRAWINGS

The invention disclosed herein will be understood better with reference to the following drawings of which.

Description of Numerals

1 . . . metallic support plate, 2 . . . insulation substrate, 3 . . . metallic heat dissipation plate, 4 . . . thermal stress relieving material, 5 . . . semiconductor element, 6 . . . brazing layer, 7 . . . aluminum wire, 8 . . . threaded hole for fastening semiconductor device, 9, 10 . . . sealing resin, 11 . . . electrode, 12 . . . casing, 13 . . . lead wire, 14 . . . cover, 15 . . . diode element, 16 . . . IGBT element, 17 . . . electrode, 18 . . . mesh body, 19, 21, 22, 24 . . . copper plates, 20,23 . . . molybdenum plates, 25 . . . laminate of thermal stress relieving material and metallic heat dissipation plate, 26 . . . machined bottom surface, 27 . . . tapered edge, 28 . . . groove, 29 . . . Cu foil electrode, 111 . . . Si semiconductor chip, 111a . . . IGBT chip, 111b . . . diode chip, 112 . . . Tin-base antimony solder, 113 . . . Mo stress buffer plate, 114 . . . Cu heat dissipation plate serving as collector electrode, 115, 117 . . . Pb—Sn solder layer, 116 . . . insulation plate, 118 . . . Cu module support substrate, 121 . . . Ag—Sn solder layer, 122 . . . composite plate bonding stress buffer plate and heat dissipation plate, 123 . . . composite plate with a machined bottom surface, 124 . . . composite plate with a pressed bottom surface, 131, 133 . . . Sn-base antimony filled solder layer, 132 . . . insulation plate for terminal.

PREFERRED EMBODIMENTS

Example 1

Figure 1:
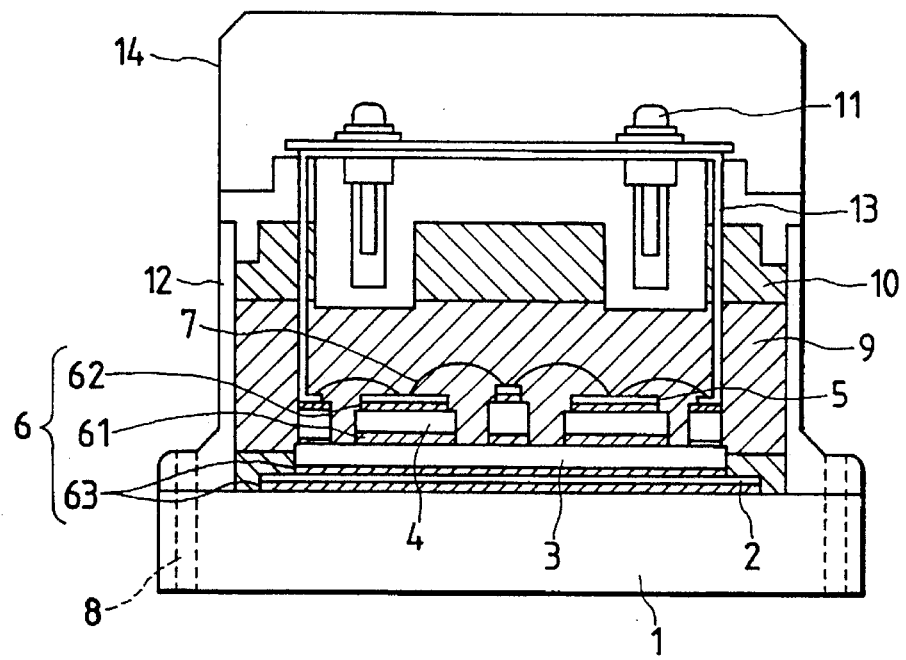
FIG. 1 is a cross-sectional view of an IGBT.
Figure 2:
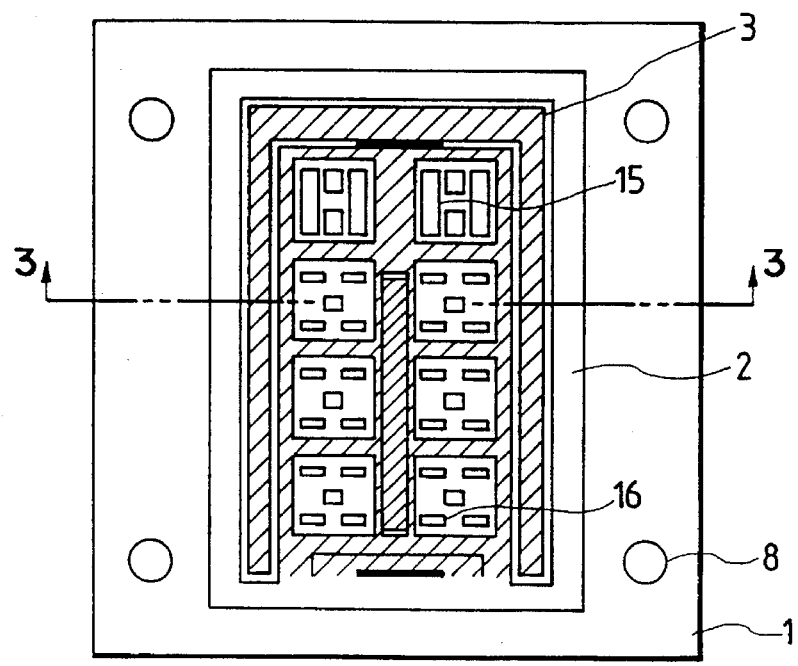
FIG. 2 is a top view of the IGBT.
Figure 3:
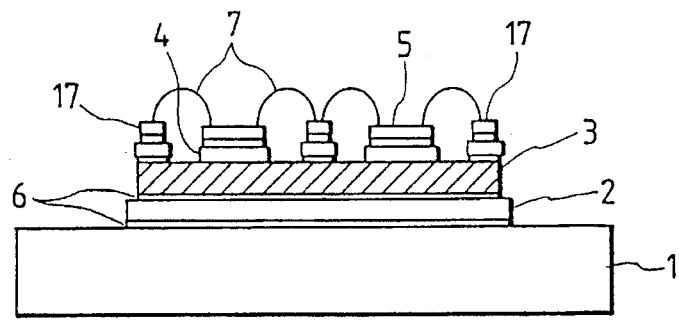
FIG. 3 is a cross-sectional view of an IGBT substrate.
Figure 4:
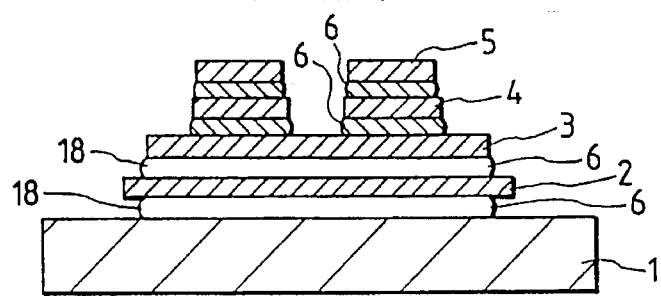
FIG. 4 is a structure of a conventional IGBT.
Figure 5:
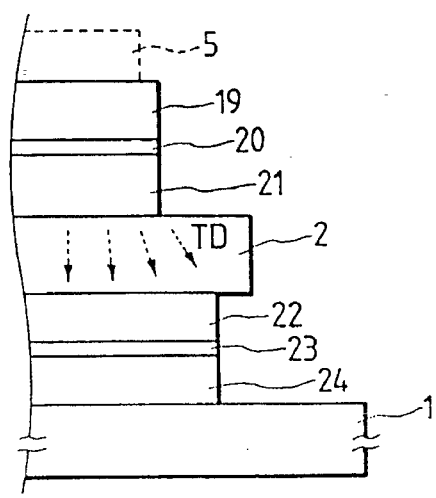
FIG. 5 is a structure in part of the conventional IGBT.
Figure 6:
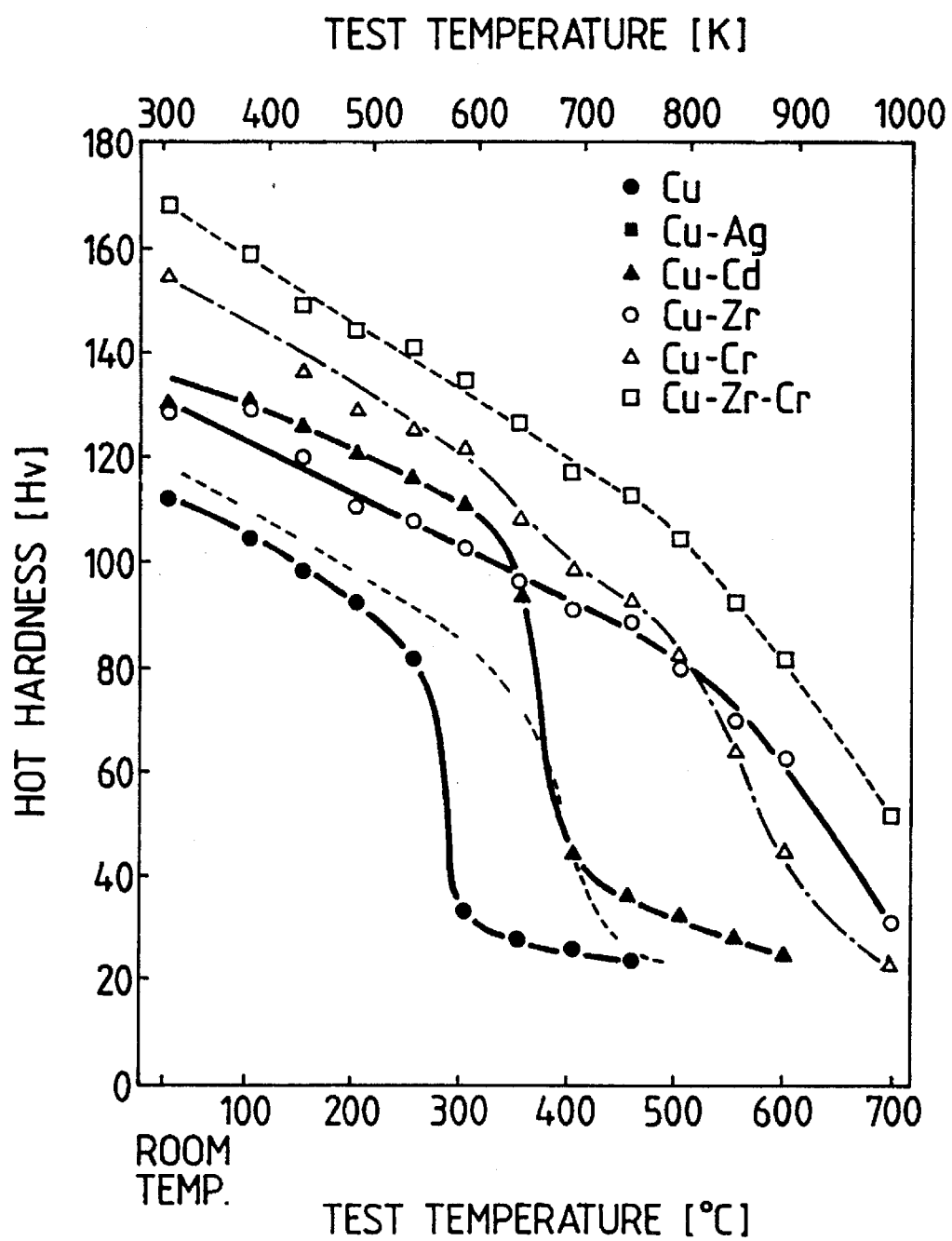
FIG. 6 is a diagram indicative of hot hardness of Cu alloys subjected to ageing treatment.
Figure 7:
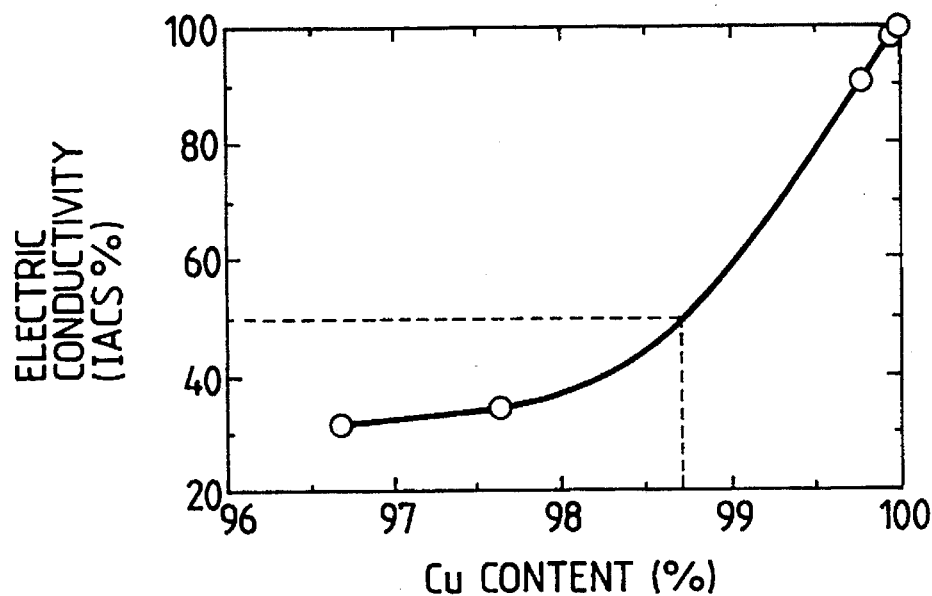
FIG. 7 is a diagram of an example indicative of a relationship between Cu content and electric conductivity.
Figure 17A:
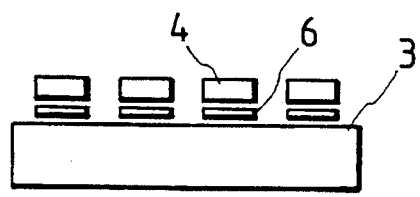
FIG. 17(a) and 17(b) are schematic diagram indicative of a warp in a composite plate.
Figure 17B:
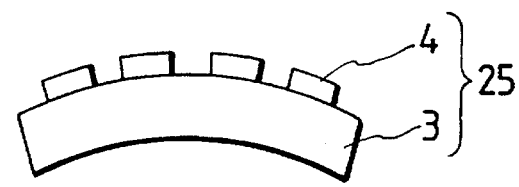

FIG. 1 shows a cross-section view of an IGBT module, FIG. 2 shows a plan view only of an IGBT substrate with its casing, resin and the like removed. FIG. 3 is a cross-section view of an IGBT substrate of one embodiment of the invention. An IGBT module is accomplished by the steps of soldering a lead wire 13 to an IGBT substrate which is assembled by a process to be described later, placing it inside a case 12 made of epoxy resin, then filling a silicone gel 9 in order to ensure an adequate withstand voltage for its semiconductor element, then filling epoxy resin (hard resin) 10 for hermetic sealing of the silicone gel as well as fixing the lead wire 13, attaching an electrode 11, and encasing the module inside a cap 14 made of epoxy resin. A metallic support plate at the downmost portion of the IGBT substrate is fixed at a predetermined position with screws. A process for assembling the IGBT substrate will be described below. A heat dissipation plate 3 made of Cu—Cr—Zr of 4 mm thickness and blocks 4 of 1 mm thickness of thermal stress relieving material made of 99% purity Mo arrayed 4 rows by 2 columns with 8 pieces in total are bonded together with an Au-20% Sn solder 61 to provide a bonded member 25 as shown in FIG. 17. Then, 8 pieces of semiconductor elements 5, the same number corresponding to the thermal stress relieving material, and an electrode 17 with an insulation layer of $Al_2O_3$ are bonded respectively onto corresponding Mo blocks 4 or onto a heat dissipation plate 3 made of Cu—Cr—Zr using an Sn-5% Sb solder 62 or the like. Then, an insulation substrate 2 of 0.7 mm thickness made of $Al_2O_3$ ceramic and a support plate made of pure copper of 10 mm thickness are bonded together using Sn-40%Pb solder 63, and then, the module is encapsulated with resin to provide a semiconductor device as shown in FIG. 1. The metallic heat dissipation plate 3 adopted here is a Cu-based alloy containing Cu as its main component, 1.1 weight percent Cr and 0.11 weight percent Zr, which is subjected to a solution treatment at 1000° C. for 1 hour, then to an ageing treatment at 500° C. for 3 hours, and which is adapted to have an elastic constant 130 MPa prior to bonding, a thermal conductivity of 340 J/sec.m.K, an electric conductivity of 83% in IACS, and a softening point approximately at 580° C.

As a result of an experimental power cycle test to simulate an ageing deterioration by repeating start and stop operation for a unit of ten minutes on the encapsulated semiconductor device having the foregoing arrangement, it was confirmed that no increase in thermal resistance nor deterioration of electrical performance have been observed even after repetition of over 50 k cycles, thereby proving a power cycle lifetime more than 5 times longer than a conventional semiconductor device which utilizes a pure copper heat dissipation plate.

Example 2

Figure 8:
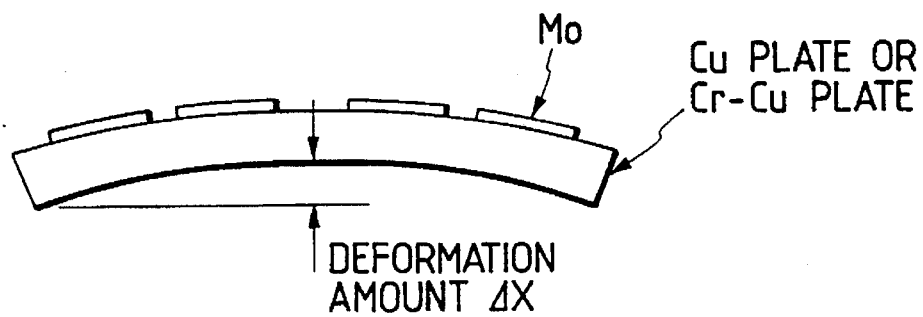
FIG. 8 shows a method of measuring a deformation amount in a metallic head dissipation plate.
Figure 9:
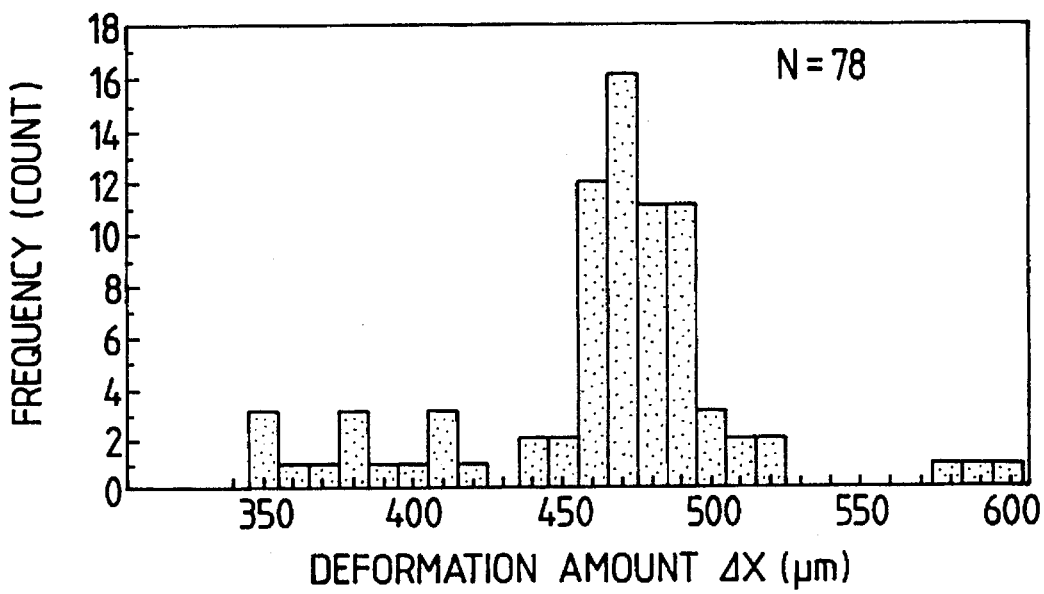
FIG. 9 shows deformation amounts in metallic heat dissipation substrates using pure copper.
Figure 10:
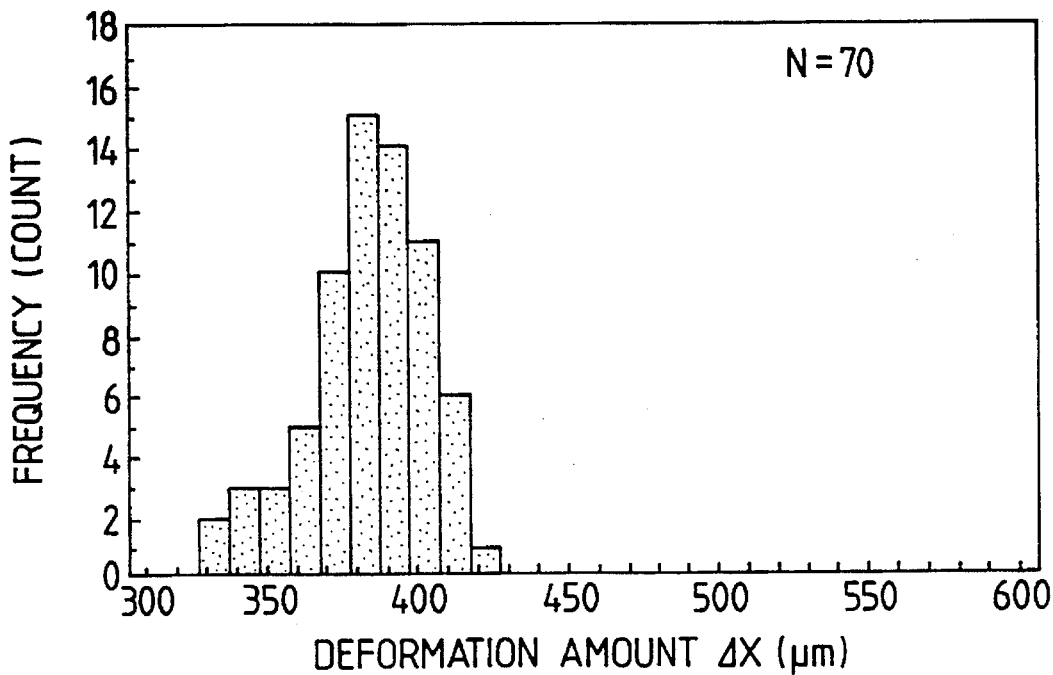
FIG. 10 shows deformation amounts in metallic heat dissipation substrates using Cu—Cr alloy of the invention.

In order to elucidate correlations of a warp resulting in the substrate after bonding and the occurrence of a defect in the bonded layer relative to a softening temperature of the metallic heat dissipation plate, two types of test pieces of metallic heat dissipation plate; one consisting of Cu-1.0 weight percent Cr according to the invention of which the softening temperature is 540° C.; the other consisting of pure copper of which the softening temperature is 280° C., have been prepared for comparison, onto one surface of each test piece thereof are bonded 8 pieces in all of thermal stress relieving material (1 mm thick) made of Mo arrayed in 4 rows by 2 columns using Au-20% Sn solder thereby to examine each deformation amount of each test piece after bonding. Each deformation amount is examined as shown in FIG. 8 at a major length using a laser interferometer substrate flatness measuring instrument. In FIG. 9 is shown a distribution of deformation amounts obtained using the conventional pure copper plate while in FIG. 10 is shown a distribution of deformation amounts obtained using the Cu—Cr alloy heat dissipation plate. The numbers of test pieces prepared for comparison were 78 and 70, respectively. It is clearly seen from the drawings that a peak of counts of deformation amounts for the pure copper plate is centered around in the vicinity of 460 to 490 μm whilst that of the deformation amounts according to the invention is centered around 370 to 400 μm, that is, smaller by about 100 μm.

Figure 11:
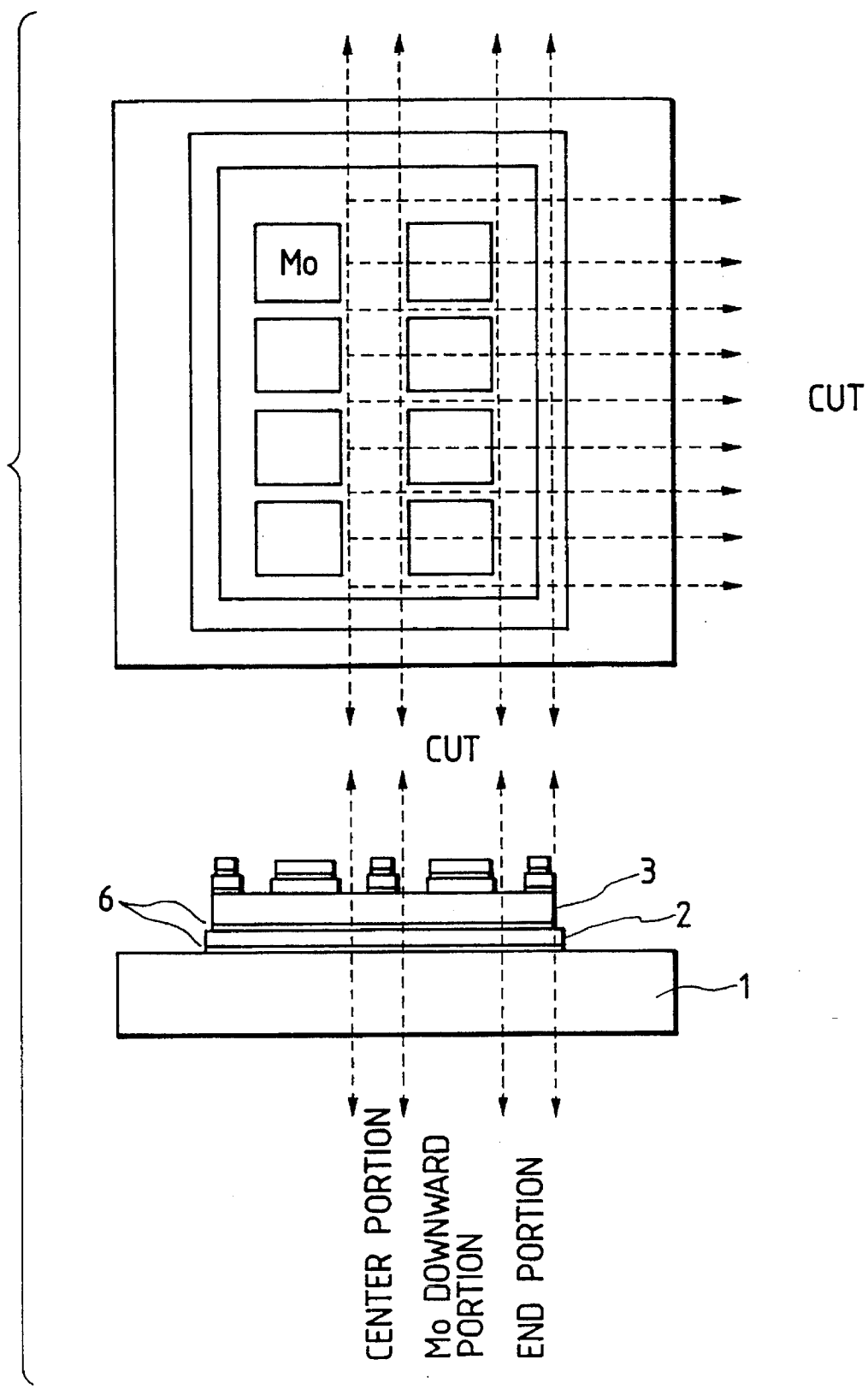
FIG. 11 illustrates a method for sampling testpieces for measuring shear strength of brazing layer.
Figure 12:
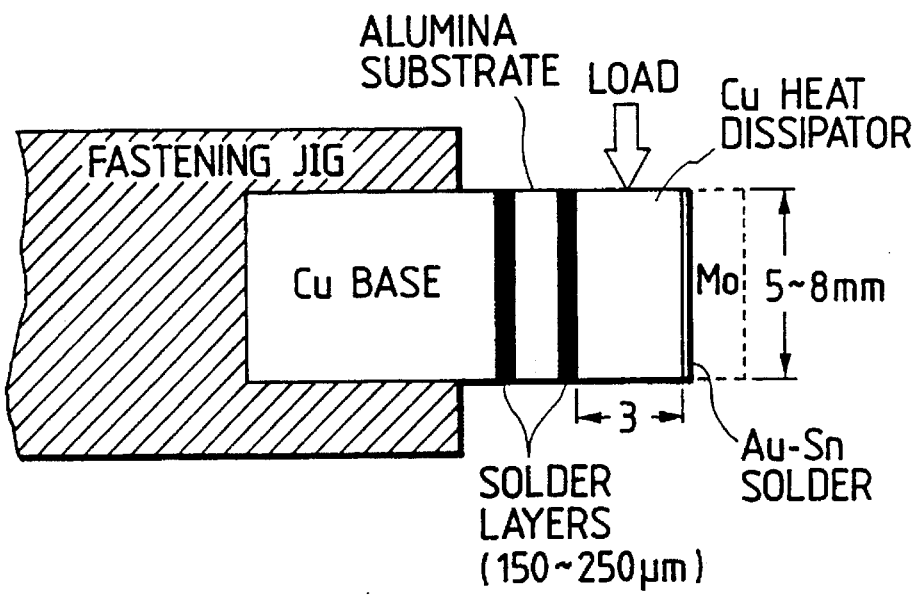
FIG. 12 is a method for measuring shear strength of brazing layer.
Figure 13:
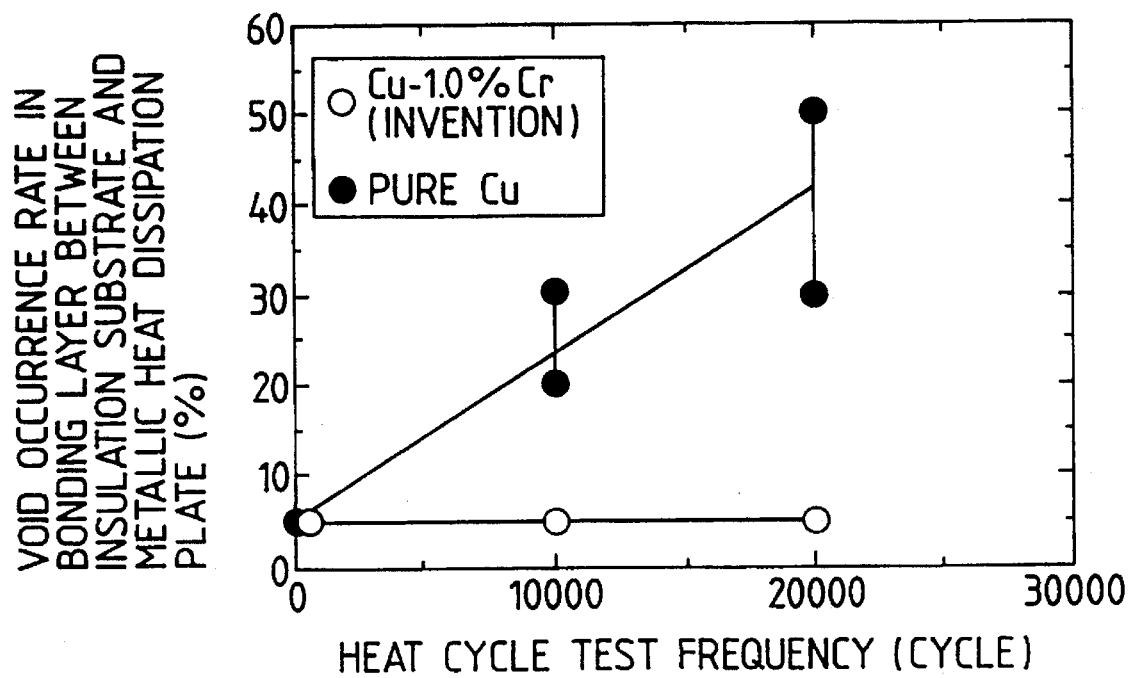
FIG. 13 plots the result of observation on the brazing layers conducted by ultrasonic detection method.
Figure 14:
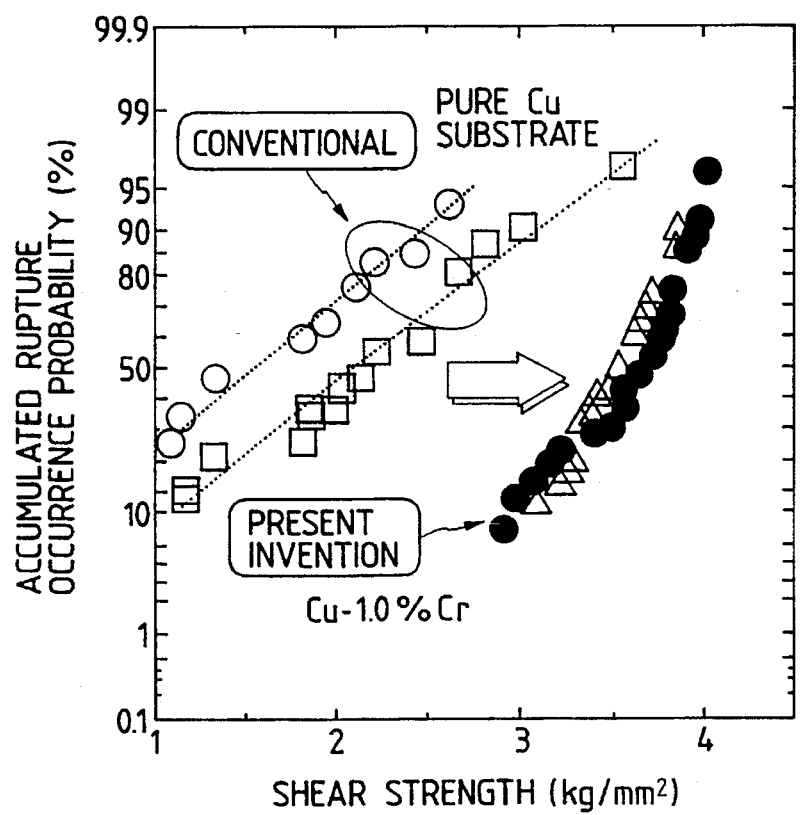
FIG. 14 plots the result of measurements on shear strength of the brazing layers.

Further, those substrates described above are bonded with an insulation substrate and a metallic support plate respectively, then subjected to a heat cycle test in which a temperature cycle from room temperature to 150° C. is repeated. Then, a defect occurrence rate (a void occurrence rate) in the bonded layers (brazing filler material) after the test was examined by the ultrasonic non-destructive test method. Further, the substrate thus obtained is cut into pieces as shown in FIG. 11, and they are subjected to a shearing test as shown in FIG. 12 to examine bonding strength at respective bonded portions. With reference to FIG. 13 there is shown a relation between a heat cycle frequency and a void occurrence rate. The heat dissipation plate that used Cu—Cr alloy of the invention has shown no substantial changes in its void occurrence rate from its original value as assembled at cycle O increasing little even after repeated heat cycles. In contrast, the heat dissipation plate that used pure copper has shown a proportional increase in its void occurrent rate with respect to an increasing cycle of tests. Each of a pair of solid points over the same cycle of tests denote a data variance. In the temperature cycle test, when the temperature rises, a warp in the metallic heat dissipation plate becomes smaller due to a stress relaxation, however, when the temperature returns to the room temperature, the warp becomes greater once again. Through repetition as above, there occurs a crack and a gap in the bonded portion. With reference to FIG. 14 there is shown a relation between an accumulated rupture probability and a shearing strength obtained for respective substrates after their shearing tests after the aforementioned temperature cycle tests. It can be seen from the drawing that at an accumulated rupture probability 50%, a shearing strength in the case of Cu-1.0 weight percent Cr alloy is 1.5 times or more greater than that in the case of pure copper. In addition, from the fact that its shearing strength is 3 kg/mm² at minimum for the former, it can be known that its bonded portion is bonded almost uniformly. In conjunction with the result of FIG. 13, it can be concluded that when Cu-1.0 weight percent Cr alloy is used as the metallic heat dissipation plate and the metallic support plate, the occurrence of cracks and gaps in the brazing filler can be suppressed thereby greatly increasing its shearing strength.

Example 3

A semiconductor device having the same structure as the example 1 described above, was produced using a metallic heat dissipation plate 3 comprised of a Cu-0.7% weight percent Cr alloy according to the invention which after being subjected to a solution treatment at 950° C. for 1 hour was further subjected to ageing treatment at 500° C. for 4 hours. The property of material of the aforementioned alloy has an elastic constant of 140 MPa, a thermal conductivity of 320 J/sec.m.K, an electric conductivity of 83% in IACS, and a softening point near 450° C. This semiconductor device has been subjected to a power cycle test for 50 k cycles to determine its electrical property and thermal resistivity. As a result, likewise with the example 1, this semiconductor device is confirmed to have an improved power cycle lifetime more than 5 times greater than a conventional semiconductor device which used the pure copper heat dissipation plate.

Example 4

A semiconductor device having the same structure as the example 1 described above was produced further using a metallic support plate and a metallic heat dissipation plate both comprised of a Cu-0.1% weight percent Zr alloy according to the invention which after being subjected to a solution treatment at 1000° C. for 1 hour was further subjected to ageing treatment at 500° C. for 4 hours. The property of material of the aforementioned alloy has an elastic constant of 130 MPa, a thermal conductivity of 360 J/sec.m.K, an electric conductivity of 94% in IACS, and a softening point near 450° C. This semiconductor device has been subjected to a power cycle test for 50 k cycles to determine its electrical property and thermal resistivity. As a result, likewise with the example 1, this semiconductor device is confirmed to have an improved power cycle lifetime more than 5 times longer than a conventional semiconductor device which used the pure copper heat dissipation plate.

Example 5

A semiconductor device having the same structure as the example 1 was produced further using a metallic support plate and a heat dissipation plate both comprised of Cu-1.0 weight percent Cr-0.1 weight percent Zr-0.03 weight percent Ti alloy which after being subjected to a solution treatment at 850° C. for 1 hour was further subjected to an ageing treatment at 500° C. for a half hour, wherein the foregoing metallic heat dissipation plate 3 and Mo block 4 serving as a thermal stress relieving material are bonded together with an Au-20 weight percent Sn brazing material. The property of material of the aforementioned alloy has an elastic constant of 130 MPa, a thermal conductivity of 360 J/sec.m.K, an electric conductivity of 94% in IACS, and a softening point at about 450° C. This semiconductor device has been subjected to a power cycle test for 50 k cycles to determine its electrical property and thermal resistivity. As a result, likewise with the example 1, this semiconductor device is confirmed to have an improved power cycle lifetime more than 5 times longer than a conventional semiconductor device which used the pure copper heat dissipation plate.

Example 6

Figure 15:
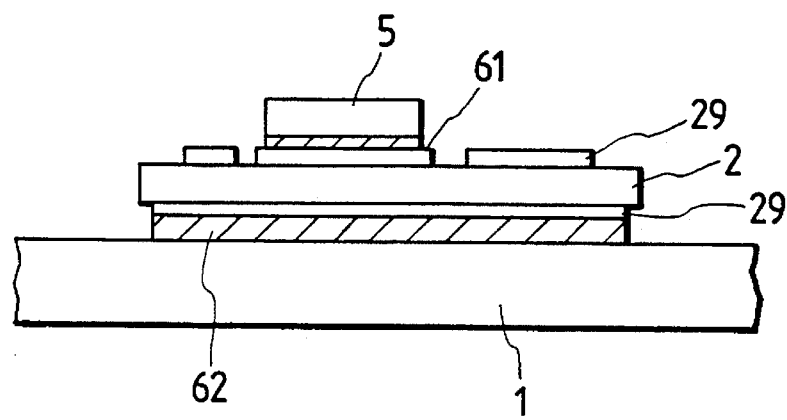
FIG. 15 is a cross-sectional view of a semiconductor substrate using an insulation substrate having a Cu foil electrode.

A metallic support plate for supporting an IGBT substrate having a structure as shown in FIG. 15 is composed of a Cu-0.15 weight percent Zr alloy which was subjected to a solution treatment at 950° C. for 1 hour, and further to an ageing treatment at 500° C. for 3 hours. This was incorporated into an IGBT module, and subjected to a power cycle test for 50 k cycles in the same manner as for the above example 1 to examine its electric property and thermal resistivity. As a result, it was confirmed that this semiconductor device likewise the above example 1 has an improved power cycle lifetime more than 5 times longer than a conventional semiconductor device using the pure copper heat dissipation plate.

Example 7

Figure 16:
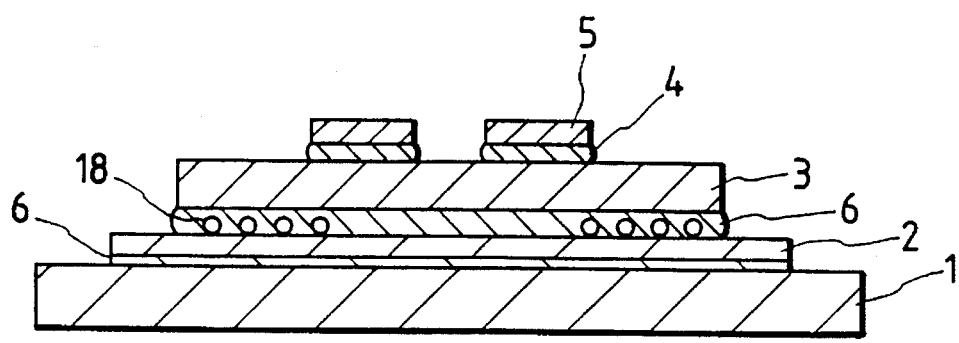
FIG. 16 is a cross-sectional view of a semiconductor substrate with a metallic mesh member combined.

In the above example 5 according to the invention, a mesh structure member made of Ni is inserted in a bonding layer between the metallic heat dissipation plate 3 and the thermal stress relieving material 4 as shown in FIG. 16, and they are bonded with a brazing material. Through such an arrangement a uniform thickness of the brazing filler has been attained thereby ensuring a prolonged power cycle lifetime longer than that of the example 5.

Example 8

Figure 18:
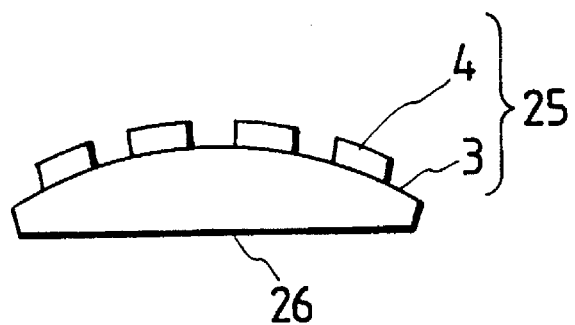
FIG. 18 is a schematic diagram indicative of machining of the bottom surface of a metallic heat dissipation plate.

In the above example 5 according to the invention, a bonded member 25 obtained by bonding together a metallic heat dissipation plate 3 and a thermal stress relieving material 4 as shown in FIG. 17 was machined to provide a flat surface on the opposite surface 26 as shown in FIG. 18. Since its semiconductor device obtained subsequently by bonding thereto an insulation substrate and a metallic support plate also could reduce thermal stresses occurring in their bonding layers, a prolonged power cycle lifetime substantially longer than that of the example 5 has been obtained.

Example 9

Figure 19:
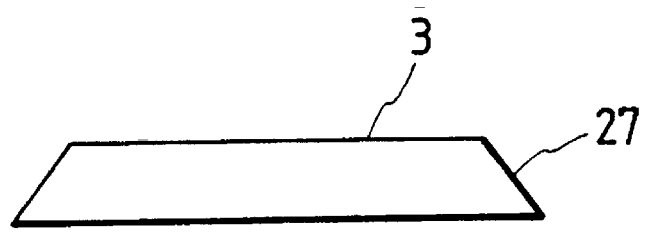
FIG. 19 is a schematic diagram indicative of tapering of the metallic heat dissipation plate.

In the example 5 of the invention, an edge portion 27 of the metallic heat dissipation plate 3 is tapered by machining as shown in FIG. 19. A semiconductor device obtained consequently by bonding an insulation substrate and a metallic support plate thereto exhibited such that the thermal stress occurring in its bonding layers could be reduced substantially, thereby ensuring an improved power cycle lifetime better than that of the example 5 to be obtained.

Example 10

Figure 20:
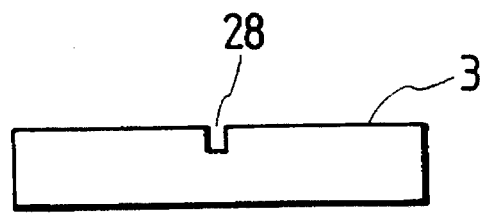
FIG. 20 is a schematic diagram indicative of cutting a groove into the metallic heat dissipation plate.

In the example 5 of the invention, the metallic heat dissipation plate 3 is further machined to have a groove 28 in the surface thereof on which the thermal stress relieving material is to be bonded as shown in FIG. 20. A semiconductor device obtained consequently by bonding an insulation substrate and a metallic support plate thereto exhibited such that the thermal stress occurring in its bonding layers could be reduced substantially, thereby ensuring an improved power cycle lifetime better than that of the example 5 to be obtained.

Example 11

For the semiconductor substrate having the structure of FIG. 15, a metallic support plate 1 of 10 mm thickness is utilized which is a Cu-0.2 weight percent Ag alloy, and which is subjected to a solution treatment at 950° C. for 1 hour, then to an ageing treatment at 500° C. for 3 hours. Its assembly includes the following steps. Firstly, an AlN substrate of 1 mm thick having a high thermal conductivity has been employed as an insulation substrate 2 on which, after bonding a Cu foil as an electrode 29 on both surfaces upper and bottom thereof, 8 pieces of semiconductor elements 5 in all arrayed 4 columns by 2 rows are bonded using Au-20% Sn solder 61. This sub-assembly is further bonded to a metallic support plate 1 using Sn-5% Sb solder 62, which likewise the example 1 is encapsulated in a case and molded with a resin or the like to provide an IGBT module. This IGBT module has been subjected to a power cycle test for 50 k cycles in the same manner as in the example 1 to examine its electric property and thermal resistivity. As a result, it has been confirmed that it has an excellent power cycle lifetime over 5 times longer than that of the conventional semiconductor device which used pure copper as its metallic support plate.

Example 12

In the foregoing example 11, a bonding layer between the metallic support plate and the insulation substrate is adapted to have a thickness of 100 μm by interposing a frame (rectangle) made of 99.0% purity Ni wire with 0.1 mm diameter, and is bonded with Sn-5% Sb solder therebetween to fabricate an IGBT substrate, and which is encased in a cap and molded with resin to provide an IGBT module in the same manner as in Example 1. This IGBT module has been subjected to the same test as in Example 1, and it is confirmed that an excellent lifetime better than that of Example 1 is attainable.

Example 13

Figure 21:
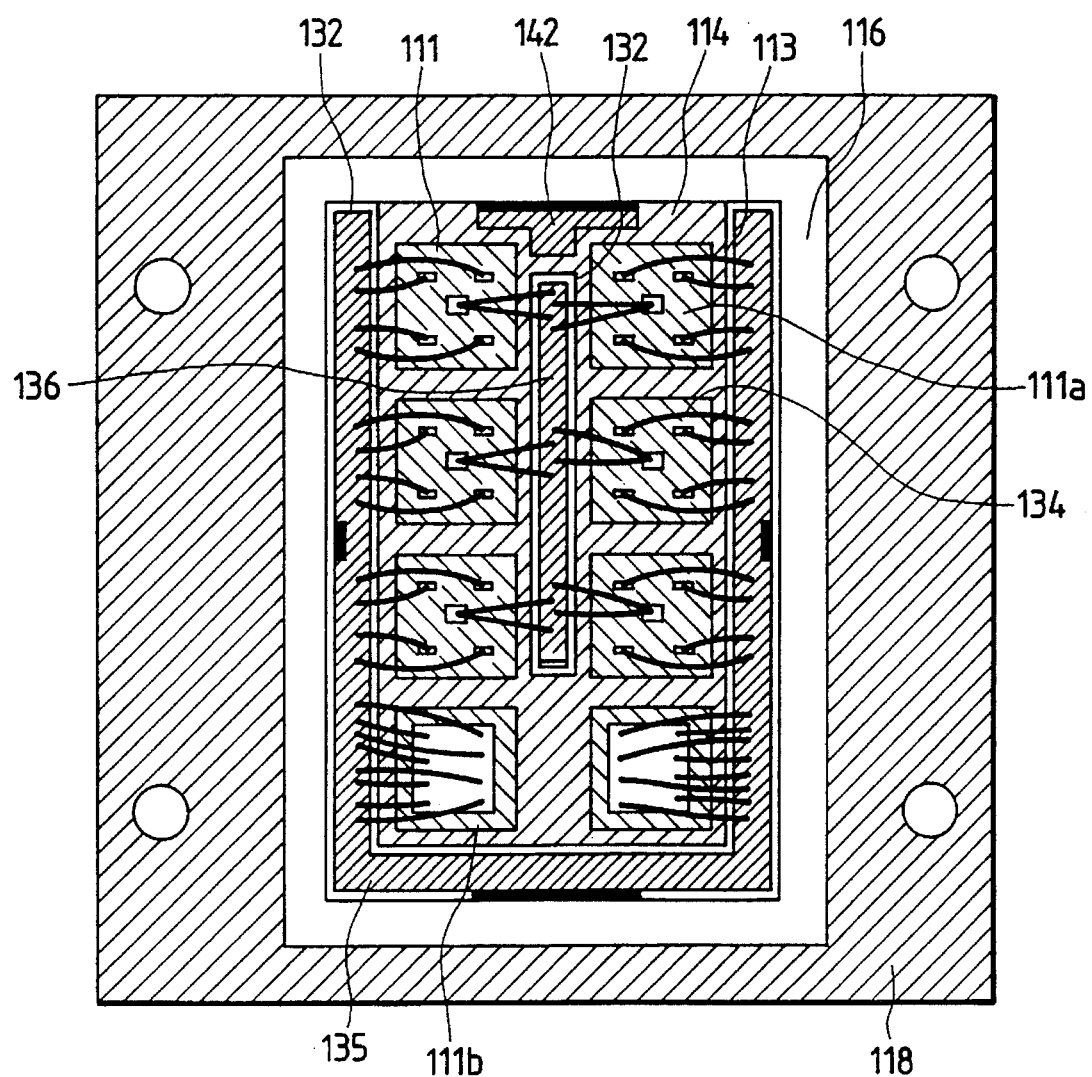
FIG. 21 is a top view of a power semiconductor module of one embodiment of the invention.
Figure 22:
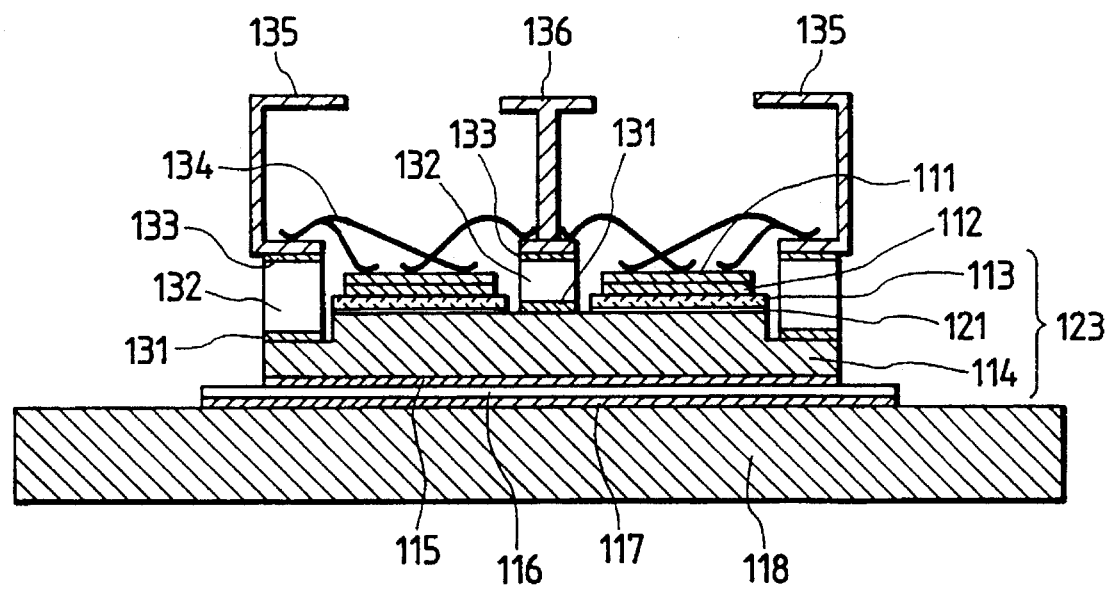
FIG. 22 is a cross-sectional view of the one embodiment shown in FIG. 21.

With reference to FIGS. 21 and 22 there is shown one embodiment of the invention which having integrated IGBTs and diodes into one package according to the invention is applied to a power semiconductor module suitable for use as a main circuit element in inverter equipment.

In the drawing of FIG. 21, of all 8 pieces of Si semiconductor chips 111, 6 pieces thereof shown in the upper denote IGBT chips 111a, while the remaining two pieces shown downward denote diode chips 111b.

Then, these Si semiconductor chips 111 are bonded in lamination on the surface of Mo stress relieving plate 113 using a metallic brazing filler such as a solder layer 112 containing, for example, Sn as a base element and antimony, more particularly, 5% antimony-0.6% nickel-0.05% phosphor-Sn (5 Sb-0.6 Ni-0.05 P—Sn: hereinafter referred to as 5Sb—Sn).

On the other hand, this Mo stress relieving plate 113 is connected in advance to a heat dissipation plate 114 made of Cu material via 80% Au—Sn solder layer 121. Hereinafter, this Cu heat dissipation plate 114 bonded with Mo stress relieving plate 113 is referred to as a composite plate 123.

Then, this composite plate 123 is bonded to a module support substrate made of copper via an insulation plate 116 made of $Al_2O_3$ (alumina) using 40% Pb—Sn solder layers 115 and 117, for example.

A collector common electrode terminal 142 is bonded to the heat dissipation plate 114 which also serves as a collector electrode for IGBT chips 111a via a solder layer consisting of the same material as the solder layer 115 which is not shown.

On the other hand, emitter electrodes of IGBT chips 111a and anode electrodes of diode chips 111b are wire-bonded to an emitter electrode terminal 135 by means of Al (aluminum) wires 134. Then, this emitter terminal 135 is bonded to a terminal insulation plate 132 comprised of $Al_2O_3$ via 5Sb—Sn solder layer 133. Further, this terminal insulation plate 132 is also bonded to the heat dissipation plate 114 which serves also as the collector common electrode via 5Sb—Sn solder layer 131.

Figure 23:
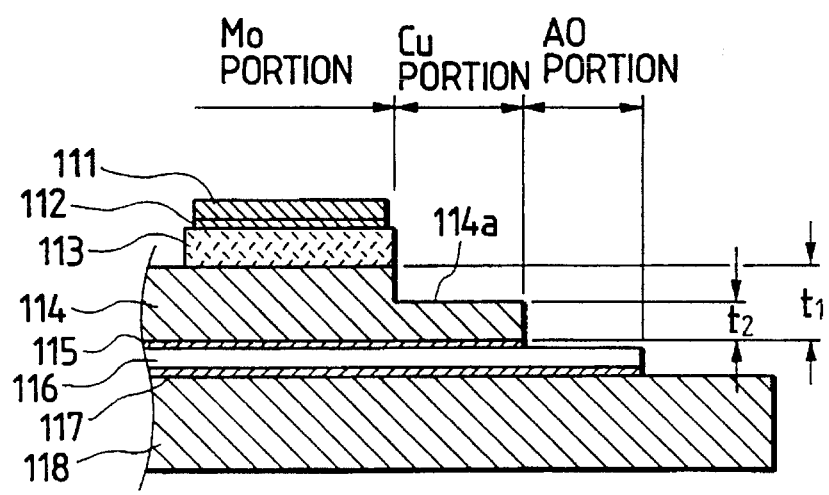
FIG. 23 is a cross-sectional view in part of an enlarged portion of the one embodiment of the invention.

With reference to FIG. 23, there is shown in part an enlarged portion in detail of a structure in the periphery of Cu heat dissipation plate 114 of the one embodiment of the invention as shown in FIGS. 21 and 22, which structure being optimized according to the invention, wherein in the peripheral portion of Cu heat dissipation plate 114, a subsection thereof on which Si semiconductor chip 111 is not mounted is defined as a Cu portion, a subsection in the peripheral portion inward from the Cu portion is defined as a Mo portion, and a subsection in the peripheral portion outward from the Cu portion where an insulation plate 116 is partially exposed is defined as an AO portion.

As delineated in FIG. 23, in this embodiment of the invention, the Cu heat dissipation plate 114 with a thickness of $t_1$ is counterbored in its Cu portion to a thickness of $t_2$ to form a thin portion 114a.

As a result, in this embodiment of the invention, a thermal stress appearing in the Cu heat dissipation plate 114 is adapted to vary between its Mo portion and Cu portion, thereby enabling an optimized structure thereof to be obtained.

Next, relations of thermal resistivities relative to respective components in the module will be described below. In the solder layer 112 immediately below the Si semiconductor chip 111, which transfers heat generated in the Si semiconductor chip 111 uniformly toward the support substrate 118 through the whole surface thereof, should a crack due to thermal fatigue propagate, thermal resistivity of its module increases in proportion to a length of its crack propagation, and the thermal resistivity thereof increases abruptly when its crack propagates, for example, extending over a substantially narrow region of margin provided for dividing one wafer into plural chips on the Si semiconductor chip, where no element is formed, thus no heat is generated.

On the other hand, solder layers 115 and 117 which bond the Cu heat dissipation plate 114 and the substrate 118 via alumina insulation plate 116, since their whole surfaces do not necessarily contribute to heat transfer, are allowed to have a region which does not take part in increasing the thermal resistivity even if a crack propagates partially in their solder layers.

For example, with reference to FIG. 23, in case a width of the Cu portion in the drawing is widened more than $t_1$ which is the thickness of the heat dissipation plate 114, even if a crack propagates in the solder layer 115 corresponding to the widened portion, a change in its thermal resistivity is negligible.

Likewise, in the insulation plate 116, since its heat transfer in both directions is little, even if a crack propagates in the AO portion in the solder 117, a change in its thermal resistivity is negligible.

With reference to Table 1, there are shown rates of changes in thermal resistivity when there occurred crack propagation in solder layers due to thermal fatigue. As is obvious from the table, there occurred no change in thermal resistivity in the solder layer 117 even when cracks propagated throughout the AO portion.

TABLE 2

| SOLDER CRACK REGION | | | |
|---|---|---|---|
| SOLDER 115 | NON | NON | ALL OVER AO & Cu PORTIONS |
| SOLDER 117 | NON | ALL OVER AO PORTION | ALL OVER AO & Cu PORTIONS |
| THERMAL RESISTIVITY RISE RATIO | — | 1.00 | 1.18 |

And, even in a case when cracks propagated throughout all part of the solder layers 115 and 117 corresponding to Cu portion, an increase in its thermal resistivity is merely by 118%.

Now, a lifetime of the module will be described in the following.

Assuming a lifetime of the module to elapse when a thermal resistivity of the module increases to 120% or more of the original value, it is analogous to a length of time until a crack which is longer than a marginal region (approximately 1 mm) on Si semiconductor chip 111 on which no element is formed is caused to propagate in the solder layer 112, or until a crack is caused to propagate throughout the whole portion in at least one of the solder layers 115 and 117 corresponding to the Cu portion.

In addition, when the module is attached to a cooling fin which is larger in size than its support substrate 118, a manner how heat propagates inside the substrate becomes a major parameter in cooling, and when a thickness of the support substrate 118 is thicker than that of the heat dissipation plate 114, even if heat is not adequately transferred in the heat dissipation plate 114, since heat is further allowed to dissipate in the support substrate 118, and the module can be cooled by the whole surface of the substrate, a change in the thermal resistivity of the module is negligible. That is, in this case, a permissible crack length can be further lengthened.

Therefore, it should be understood that in order to suppress the increase in thermal resistivity in the module as a whole, it is necessary to minimize the stress exerting on the solder layer 112 immediately below the Si semiconductor chip 111, balance stresses exerting on the solder layers 115 and 117 below the Cu portion and AO portion respectively, and prescribe such that all the lifetime of each solder layer will not decrease from its predetermined lifetime. That is because the lifetime of the module as a whole is determined by a lifetime of any solder layer which has a shortest lifetime among its solder layers.

Thereby, in this embodiment of the invention, Cu heat dissipation plate 114 is adapted to have a different thickness according to the Mo portion and Cu portion thereof by forming a thinner portion 114a in the Cu portion thereof the thickness of which is reduced to $t_2$ with respect to a thickness $t_1$ in the Mo portion, so as to appropriately balance respective stresses exerting on respective portions to be contained within an optimum condition, in consequence, such that the thermal stress exerting on a solder layer 115 which bonds the Cu heat dissipation plate 114 is adapted to change at portions thereof below the Mo portion and the Cu portion respectively.

Figure 24:
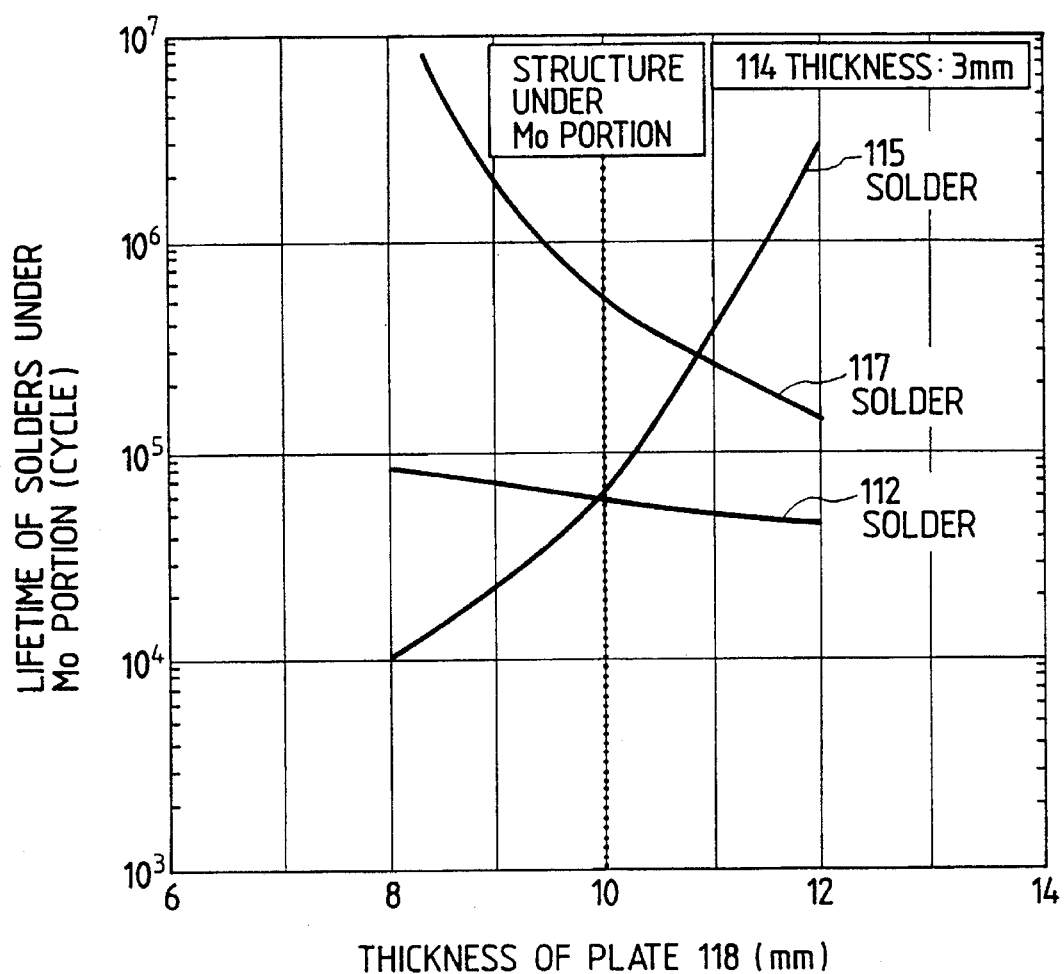
FIG. 24 is a characteristic diagram indicative of relations between lifetimes of solder layer and thicknesses of module support substrate.

With reference to FIG. 24, there are shown relations between thicknesses of respective members below the Mo portion and lifetimes of respective solder layers, and, in particular, there are shown changes in the lifetimes of the respective solder layers relative to the thickness of the Cu module support substrate 118 under the conditions that Mo stress relieving plate 113 was set at 1.3 mm thick, Cu heat dissipation plate 114 at 3.0 mm thick, and alumina insulation plate 116 at 0.64 mm thick, respectively.

In this instance, as is clear from the drawing, a condition that determines the shortest lifetime of the solder layers in the module is at a cross point where the lifetime curves of the solder layer 112 immediately below the chip and of the solder layer 115 on the insulation plate intersect, which corresponds to a thickness of 10 mm of the Cu module support substrate 118.

Such a thickness which is optimum for Mo portion, however, will not provide an optimum condition for a preferred lifetime for Cu portion of the heat dissipation plate 114 on which no Si semiconductor chip nor a Mo plate are bonded.

Figure 25:
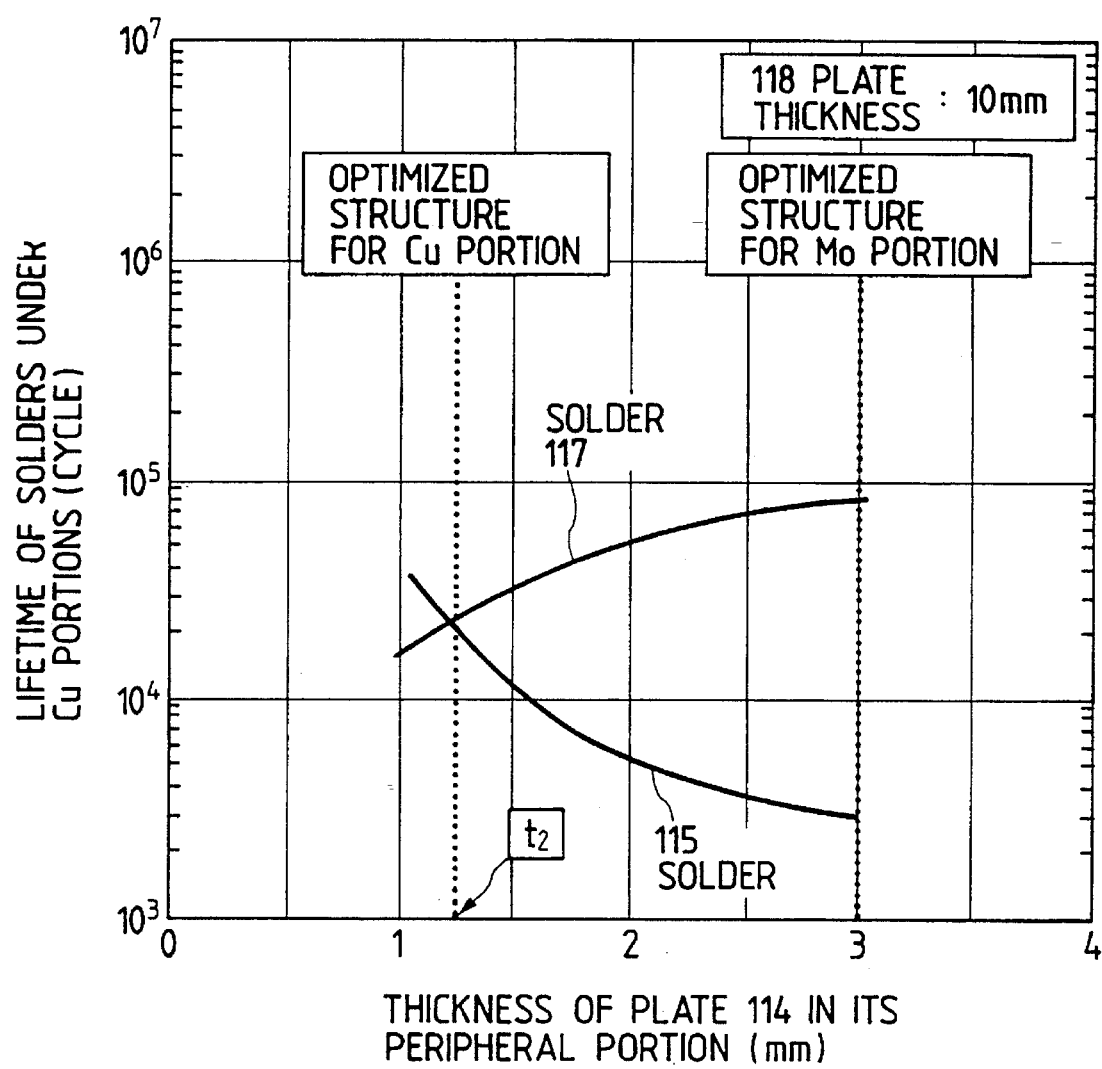
FIG. 25 is a characteristic diagram indicative of relations between the lifetime of the solder layer and the thickness of heat dissipation plate.

With reference to FIG. 25, there are shown lifetimes of each solder relative to a thickness of the heat dissipation plate 114 where its thickness in the Cu portion is changed. When its optimum thickness optimum only for Mo portion as indicated in FIG. 24 is maintained, that is, when the thin portion 114a is not formed and its thickness $t_1=t_2(=3$ mm) in reference to FIG. 23, balancing of lifetimes between solder layers 117 and 115 cannot be attained as clearly indicated in FIG. 25 since the lifetime of solder layer 117 increases while the lifetime of solder layer 115 decreases substantially.

This is because that in the Mo portion where a Si/Mo plate having a small thermal expansion coefficient is continuously bonded using a solder filler, a linear expansion coefficient in Cu heat dissipation plate 114 in contact with the solder layer 115 on the insulation plate is adapted to decrease due to a constraining effect of its composite construction, while that of a portion in the Cu portion is allowed to exhibit a linear expansion coefficient intrinsic to copper since its composite construction thereabove is removed, thereby, in consequence, it is unable to balance the stresses between respective portions.

In respect of the lifetime of the module as a whole, it is necessary to the lifetime of the solder layer immediately below the chip and that of the other solders that is defined by the time until their thermal resistivities rise substantially, thus, it becomes necessary to substantially improve the lifetime of the solder layer 115 on the insulation plate 116 without changing the structure in the vertical direction of the Mo portion.

Therefore, in this embodiment of the invention, optimization of Cu heat dissipation plate 114 to implement the advantage of the invention has been attained by forming the thin plate portion 114a in the periphery of the Cu heat dissipation plate, more specifically, by reducing its thickness in the periphery to $t_2$ in the Cu portion thereof while maintaining its thickness at $t_1$ in the Mo portion thereof.

Then, in this embodiment, it is clearly indicated in FIG. 25 that when the thin portion 114a of Cu heat dissipation plate 114 is machined to have a thickness of 1.2 mm, lifetimes of solder layers 115 and 117 disposed respectively on the upper surface and the bottom surface of the insulation plate 116 can be balanced so as to maximize the lifetime of the module as a whole.

Therefore, since it is possible according to the invention to readily optimize balancing of lifetimes between plural bonding layers through a simple modification of the structure of the heat dissipation plate, namely, by partially reducing its thickness, a power semiconductor module having an improved reliability can be manufactured at a reduced cost.

In the following are described other examples of the invention for modifying the thickness of the Cu heat dissipation plate 114 so as to have a thickness $t_1$ below the Mo portion and a thickness $t_2$ in the Cu portion.

Any type of machining can be selected for modifying the thickness thereof in accordance with a particular thickness of each plate and a particular upper structure of Cu heat dissipation plate 114, however, the example of FIG. 23 adopted the method as already described above whereby Cu heat dissipation plate 114 after being bonded with Mo plate 113 was counterbored by milling or the like so as to form a thin plate portion 114a wholly in the peripheral portion thereof.

This method of counterboring has an advantage that it is relatively simple and can be applied even when Cu heat dissipation plate 114 is very thin.

Figure 26:
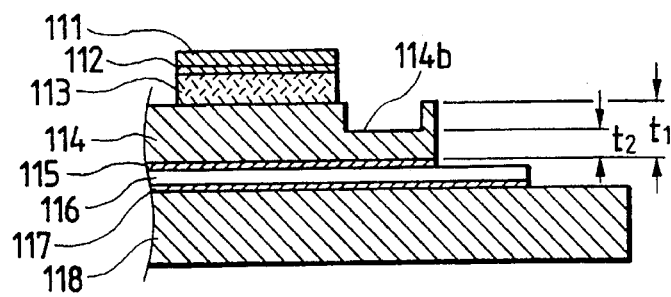
FIG. 26 is an enlarged cross-sectional view in part of another example of the invention.

With reference to FIG. 26 there is illustrated still another example of the invention, in which Cu heat dissipation plate 114 after being bonded with Mo stress relieving plate 113 is machined to provide a groove in one surface in the peripheral portion thereof by reducing its thickness so as to form a thin plate portion 114b.

Thereby, there is such an advantage according to this still another example of the invention that Cu heat dissipation plate 114 can be fabricated to provide a member on the surface thereof for readily attaching an insulation plate or the like for mounting an external electrode lead-out terminal, thus facilitating and expediting its assembly substantially.

Further, according to this example there is still another advantage that as a result of this groove forming a solder on the surface of the Cu heat dissipation plate 114 can be prevented from flowing outside the bonded portion thereof during its bonding process, and a flow of solder climbing from a solder layer 115 for bonding the Cu heat dissipation plate 114 can be prevented as well, thereby, a uniform thickness of the solder layer can be ensured and an improved lifetime of the terminal can be attained.

Figure 27:
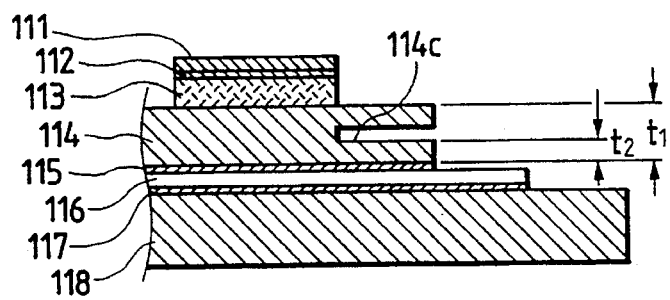
FIG. 27 is an enlarged cross-sectional view in part of still another example of the invention.

In FIG. 27 is shown still another example of the invention, wherein after bonding with Mo stress relieving plate 113, the Cu heat dissipation plate 114 is cut in a side in the peripheral portion thereof to form a slit 114c which is cut inwardly approximately parallel to the surface thereof such that the same effect can be provided to its solder layer 115 as have been provided by reducing the whole peripheral surface of the Cu heat dissipation plate 114.

Thereby, according to this example described above there is such an advantage that when there is adopted a module structure in which an external lead-out terminal is disposed in the periphery of the Cu heat dissipation plate 114 and an insulation of this external lead-out terminal is ensured in the direction of its thickness, a difference of heights between the semiconductor chip and the terminal member can be reduced.

Further, since the thickness of the insulation plate can be reduced in this embodiment, a stress exerting on the bonding layer in the peripheral portion can be reduced, thereby a lifetime of the bonding layer in the peripheral portion can be extended, and a crack due to the large stress in the insulation plate can be prevented from occurring as well.

There is still another advantage according to this example described above that at the time of bonding of the heat dissipation plate 114 to the insulation plate 116 via the solder layer 115, a flow of solder climbing from this solder layer 115 can be prevented by the slit cut in the heat dissipation plate.

All the foregoing examples of the invention have been described to have employed the aforementioned method for reducing the thickness of the heat dissipation plate 114 by machining the upper surface in the peripheral portion thereof on which Mo thermal buffer plate 113 is bonded, however, as another method for reducing the thickness thereof there is such a method whereby the bottom surface, namely the other side, of the heat dissipation plate 114 where Mo thermal buffer plate 113 is not bonded is machined at its periphery, which method and examples machined thereby will be described in the following.

Figure 28A:
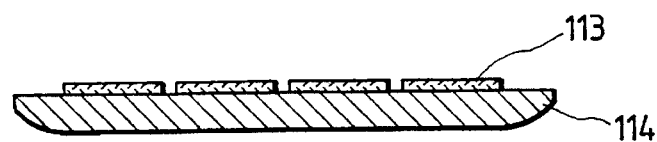
FIGS. 28(a) and 28(b) are cross-sectional views of composite plates of one example of the invention.
Figure 28B:

With reference to FIGS. 28(a) and (b), there are shown examples of the invention each end of which heat dissipation plates 114 is all cut obliquely on the surface opposite to that where Mo thermal buffer plates 113 are bonded, and where FIG. 28(a) illustrates an example that is machined to form a curvature while FIG. 28(b) illustrates an example that is machined to form a linear oblique cutting. In any of the above examples, its heat dissipation plate 114 having a thickness of $t_1$ is machined to reduce its thickness to $t_2$ at the outermost portion thereof so as to be able to delay initiation of a crack, thereby to prolong the lifetime of the module.

Further, in these examples of the invention, since a thickness of solder layer 115 can be increased in the peripheral portion of the heat dissipation plate 114, a stress applied to the solder layer 115 in this peripheral portion can be distributed in the direction of increased thickness. As a result, propagation of a crack will be further delayed, thereby the lifetime of the module will be further lengthened.

Still further, since the thickness $t_1$ of the heat dissipation plate 114 in these examples is optimized for the Mo portion in reference to FIG. 23, it is preferable for further prolonging the lifetime of the module that an extent of oblique cutting is limited to an area corresponding to the Cu portion.

Now, solder layer 117 will be explained in the following. This solder layer 117 is adapted to bond only the insulation plate 116 and a module support substrate 118 in the AO portion as shown in FIG. 23. Namely, although in the Mo portion, a single layer of solder layer 117 is subjected to distortion due to the three different members of semiconductor chip 111, Mo thermal buffer plate 113 and Cu heat dissipation plate 114, in the AO portion, however, the solder layer 117 is little affected by these three different members in lamination.

Even in this case, however, since a crack propagation in solder due to thermal fatigue is initiated in the peripheral portion of the solder layer, it is prerequisite in order to improve the overall lifetime of the module that any occurrence of distortion in the AO portion which is the outermost portion is effectively suppressed so as to improve the lifetime of the solder layer.

Figure 29:
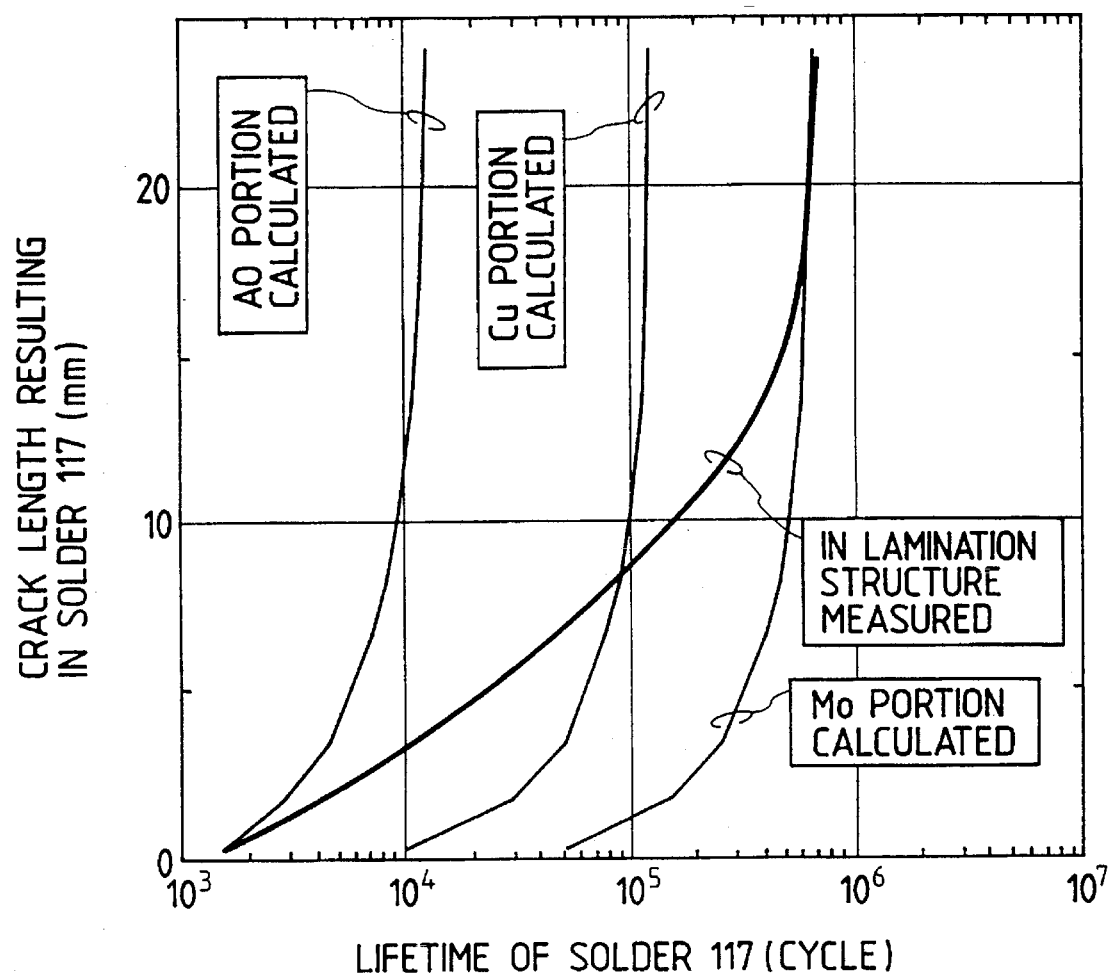
FIG. 29 is a characteristic diagram indicative of a relation between the length of cracks in solder layer and the lifetime thereof.

With reference to FIG. 29 there are shown relationships between the lifetime of solder 117 in each portion corresponding to Mo, Cu and AO portions and the crack length propagated therein when the thickness of each member is set the same as in the preceding example. Of these three portions, the solder layer 117 in the Mo portion where the occurrence of distortion downward the chip is minimized has a longest lifetime, and the lifetime decreases in the order from Cu portion to AO portion.

In consequence, a crack propagates in the structure of the preceding example along a solid thick curve as indicated in FIG. 29 taking an intermediate course between three curves indicative of three different structures, then converges into the curve indicative of the structure in Mo portion.

Assuming that the structure (thickness) in the Mo portion is not changed since the solder layer below the chip which is most sensitive to and affects the lifetime of the module is optimized, it can be learned that, in order to improve the overall lifetime of the module, it is most effective to reduce the occurrence of distortion, in particular, in the AO portion so as to retard initiation of a crack therein.

Figure 30:
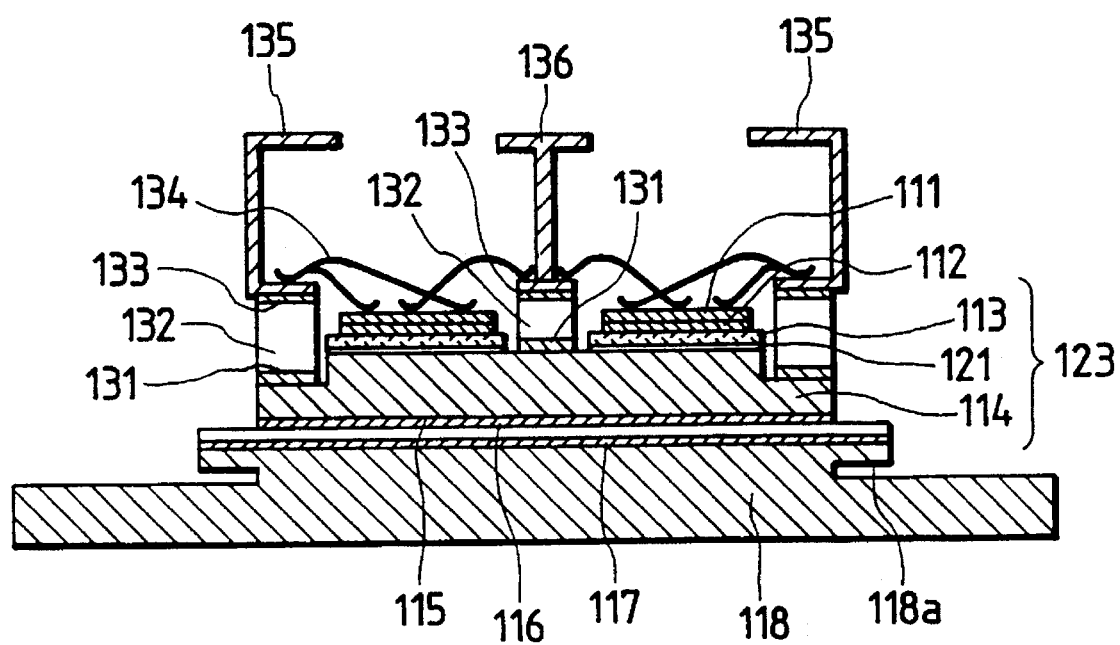
FIG. 30 is a cross-sectional view of still another example of the invention.

With reference to FIG. 30 there is shown one example of the invention in which a stress in the AO portion is reduced so as to suppress the occurrence of distortion in the manner as described above. In this one example of the invention, its module support substrate 118 comprises a thick plate portion formed in the center thereof which includes a portion on which Cu heat dissipation plate 114 is bonded, and a thin plate portion formed in its periphery by reducing the thickness thereof. Further, in this embodiment, a slit 118a is cut into the thick plate portion from its peripheral side. Thereby, according to this one embodiment of the invention, the lifetime of the solder layer 117 can be lengthened, thus, further prolonging the overall lifetime of the module.

Further, in respect of the characteristics of FIG. 29, unless a crack in the solder 115 on the insulation plate is suppressed from taking place until a crack propagation in the solder 117 below the insulation plate reaches the Cu portion, which suppression being effected by tapering at the periphery of the heat dissipation plate 114 as shown in FIG. 23, the influence of plate members above the heat dissipation plate 114 will become null. That is, no continuous bonding is provided in the Cu portion eventually having an identical structure as in the AO portion, thereby, devoid of the suppression effect to retard the crack propagation.

Thereby, in such instance as above, the lifetime of the module cannot be lengthened. According to the present invention, however, since the lifetime in the Cu portion can be balanced appropriately as described with reference to FIG. 26, it will not occur that a crack is caused to propagate in precedence exclusively in the solder layer 117 below the insulation plate 116, thus, according to the invention the lifetime of the module can be prolonged substantially due to the retardation of the crack propagation.

By way of example, the embodiments of the invention described hereinabove have been set forth as applied to the module comprising Si semiconductor chip 111, Mo stress buffer plate 113, Cu heat dissipation plate 114 and Cu module support substrate 118, or so-called Si—Mo—Cu—Al$_2$O$_3$—Cu lamination module. However, it is not limited thereto, but is applicable to many other applications using such as a Si—Mo—Cu—Al$_2$O$_3$—Cu—Cu lamination module in which another Cu substrate is added in order to enhance balancing of the stresses, a Si—Cu—Al$_2$O$_3$—Cu lamination module in which Mo stress buffer plate is removed, or the like, provided that a plate thickness in a region other than immediately below the chip is modified to have a different cross section therefrom so as to prolong the lifetime of the module to attain the same effect of the invention.

Still another embodiment of the invention will be described in the following.

With reference to FIG. 31 there is illustrated a still another embodiment of the invention in which at a stage as a stress buffer plate is lamination-bonded on one surface of a heat dissipation plate, the other surface of the heat dissipation plate is formed to have a flat surface or a convex surface thereby further to prolong the lifetime of the module. According to this embodiment, through fabrication of the heat dissipation plate such that its other surface has a flat or convex surface, any subsequent thermal deformation to take place in the following lamination bonding process is limited to appear in the peripheral portion of the bonding layer so as to reduce a residual stress therein, as a result, a stress exerting on a metallic brazing material can be reduced and a crack propagation initiating from the vicinity of the metallic brazing material can be suppressed, thereby the lifetime of the module can be prolonged.

The drawing of FIG. 31 illustrates processes from bonding a stress buffer plate and a heat dissipation plate to assembling a bonded member thus obtained into a module in comparison with the prior art. The stress buffer plate and the heat dissipation plate are first set as shown in FIG. 31(a), then, a brazing solder 121 such as 80% Au—Sn solder having a relatively low temperature melting point and a Mo stress buffer plate 113 are disposed over a heat dissipation plate 114 composed of Cu, and heated to fuse the solder 121, then cooled to provide a bonding as shown in the drawing (b). The Cu heat dissipation plate 114 thus prepared after bonding with Mo stress buffer plate 113 will be referred to as a composite plate 122.

This composite plate 122 will be deformed to have a concave surface on its bottom due to a difference in the linear expansion coefficients between Mo stress buffer plate 113 and Cu heat dissipation plate 114 as shown in the drawing (b). A deformation amount $dX_1$ thus produced is determined in dependence on its plate thickness and the like.

In the next step, the composite plate 122 comprised of the Cu heat dissipation plate bonded in advance with Mo stress buffer plate 113 is further laminated on a module support substrate 118 via an insulation plate 116, then, assembled into a module. In this subsequent lamination bonding, however, it is necessary to use a solder filler having a lower temperature melting point than that of the solder which was used in bonding the stress buffer plate 113 and the heat dissipation plate 114, thereby, 40Pb—Sn solder as mentioned above is used as a solder layer 115.

Figure 31A:
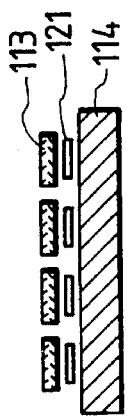
FIGS. 31(a) to 31(e) illustrate a still further example of the invention.
Figure 31B:
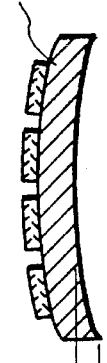
Figure 31C:
Figure 31D:
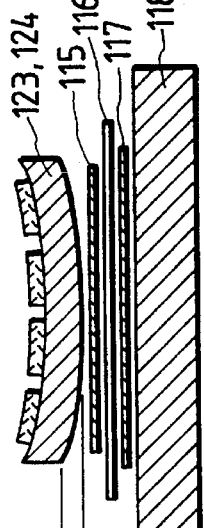
Figure 31E:
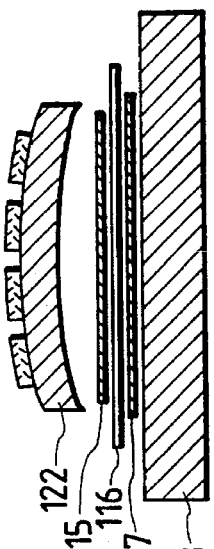

With reference to FIG. 31(e) indicative of the conventional method, since the composite plate 122 is bonded to module support substrate 118 via insulation plate 116 as deformed as above, a bottom surface shape of the composite plate 122, although its deformation amount decreases slightly when the solder layer 115 is in a melted condition, still retains a concave state as shown in the drawing, then, returns to the concave bottom surface having the initial deformation amount $dX_1$ as its temperature returns to the room temperatures.

As a result, according to the prior art, there remains a tensile stress after bonding in the center portion of the solder layer 115, and in addition, its thickness is reduced in its peripheral portion, therefore, a crack readily tends to arise after bonding, thereby shortening the lifetime of the module.

Therefore, in one embodiment of the invention, a bottom surface of the composite material 122 is formed such that although it may be deformed once to have a convex surface at the time of bonding due to a temperature rise, it is applied with a change to return to a flat surface with its deformation amount of the convex surface being reduced when the bonding material is solidified upon returning to the room temperature, thereby, such that a residual stress in the bonding material, in particular, such appearing in its peripheral portion of the bonding area is caused to decrease in consequence to minimize the stress applied to the bonding material comprised of metallic fillers such as solder or the like, thereby substantially suppressing the crack propagation initiating from the vicinity of the periphery of metallic solders, and thereby prolonging the lifetime of the module.

As one example of implementing the above-mentioned process according to the invention, the composite material 122 upon preparation thereof is formed into a composite plate 123 having a flat surface on its bottom by machining as shown on the lefthand in FIG. 31(c) or into a composite plate 124 having a flat surface on its bottom through deformation processing by pressing the composite plate 122 on an appropriate plane as shown on the righthand in FIG. 31(c). Then, as shown in FIG. 31(d), either one of the composite plates thus prepared is bonded on a Cu module support substrate 118 via alumina insulation plate 116, fore example, and using 40Pb—Sn solder layers 115 and 117, respectively.

As a result, although the bottom surface of the composite plate 122 is caused once to assume a convex shape having a deformation amount $dX_2$ at the time when the solder is melted as shown in the drawing, afterward it returns to its initial flat surface when the temperature returns to the room temperature after cooling and solidification of the solder.

Therefore, according to the foregoing one example of the process for forming the either one of the composite plates, since the stresses exerting on the solder layers 115 and 117 are minimized and it is ensured that a thickness of the solder layer 115 is not reduced in the peripheral portion thereof, the crack propagation from the periphery of the solder layer can be suppressed substantially, thereby the lifetime of the module can be prolonged accordingly.

In addition, since the example of the composite plate 123 machined to have the shape as shown on the lefthand in FIG. 31(c) is similar in its structure to that of the heat dissipation plate described above the thickness of which has been reduced in its periphery, there is another advantage that the crack initiation in the solder layer can be retarded.

Further, when bonding components on the heat dissipation plate 114 of the composite plate 123 and its temperature is raised to its bonding temperature, since its bottom surface side is caused to expand greater than the upper surface side thereof, the upper surface side is warped to assume a flat surface.

Thereby, in the case when the composite plate 123 is used, since a difference in the shapes between the above-mentioned heat dissipation plate 114 and the components to be bonded thereon can be minimized due to the warp of the heat dissipation plate 114 which warps to cancel the difference, occurrence of void in the solder layer for bonding components can be reduced.

On the other hand, in the case when the composite plate 124 shown on the righthand in FIG. 31(c) prepared by pressing is used, an overall warp over the bottom surface thereof can be corrected easily, however, it is difficult to correct local irregularities formed corresponding to respective Mo plates.

In particular, in the case there are plural semiconductor chips and plural Mo plates, it is especially difficult to cope with such irregularities, and which may allow to form gas-holds in the fused solder at the time of bonding using the solder filler 115, and it is highly probable that they remain as voids therein.

Thereby, as a countermeasure to cope with such problems it is preferable after the press forming further to subject the bottom surface to a local machining to provide an overall flatness.

In this case, by machine-cutting to remove locally press-hardened Cu material from its surface, a uniform hardness can be assured throughout the surface, thereby a dispersion in the lifetimes among solders can be minimized.

In the case of the composite plate 122, when the 80Au—Sn solder 121 was heated to its melting point, and the Mo stress buffer plate 113 and the Cu heat dissipation plate 114 were allowed to expand independently, and after that when the temperature dropped under the melting point (280° C.) of the solder 121 to solidify itself so that the Mo stress buffer plate 113 and the Cu heat dissipation plate 114 thereof are mutually constrained, the bottom surface of the heat dissipation plate 114 is caused to form the concave surface as described above due to a larger contraction amount of the Cu heat dissipation plate 114 having a larger expansion coefficient.

Figure 32:
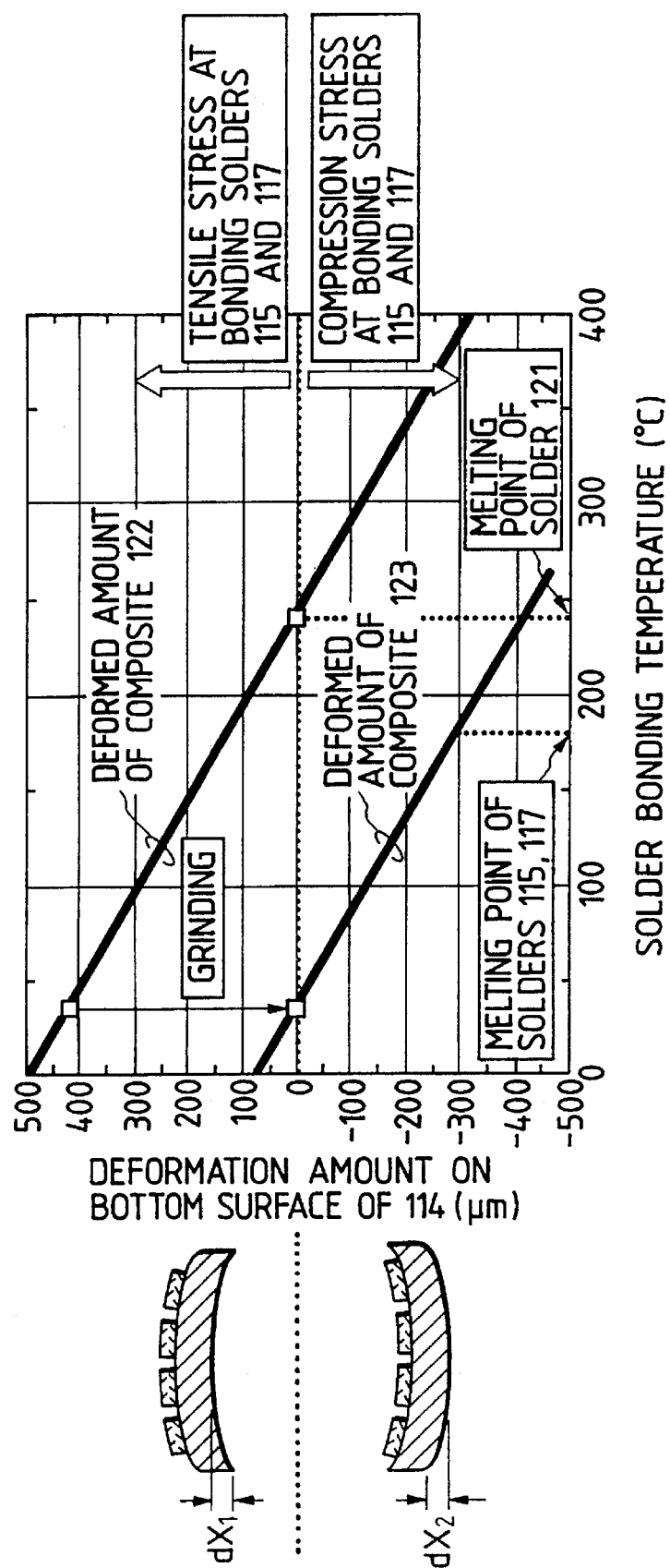
FIG. 32 is a characteristic diagram indicative of deformation amounts relative to temperature changes in the composite plate.

With reference to FIG. 32, there is indicated a result of deformation amounts measured on the bottom surface of the composite plate 122 at the time of solder bonding. When thicknesses of Mo stress buffer plate 113 and Cu heat dissipation plate 114 were set at 1.3 mm and 3.0 mm respectively, its deformation amount became approximately 0.45 mm at room temperatures as is obvious from the drawing of FIG. 32.

Then, since their deformation states during the above heat cycles undergoes a linear change as indicated in the drawing, the composite plate 122 when it is heated in the shape as prepared will not change its concave surface unless it is heated over the melting point of solder 121.

Thereby, in the case when the bottom surface is flattened according to this embodiment of the invention, the composite plates 123 and 124 are caused to have a convex shape on its bottom surface when the temperature is raised. Thereby, when incorporating the composite plate 123 or 124 into a module, the shape on the bottom surface thereof remains as convexed at the melting point (183° C.) of solder layer 115, then changes to reduce its convex amount gradually in the course of cooling and solidification of the solder layer.

Therefore, since a stress exerting on the solder layer 115 in the direction of its thickness remains as a compression, which can provide an ideal condition for solder bonding, and thus minimize a shearing stress acting on the solder layer, a resultant bonding strength can be improved substantially and its reliability can be enhanced.

On the other hand, in the case where a module is assembled using the composite plate 122 as prepared as shown on the righthand in FIG. 31, the bottom surface of the composite plate 122 retains its concave shape even when the solder layer 115 is in a melted state. Then, in the course of cooling and solidification of the solder layer 115, a concave amount in its concave surface changes on the increase.

Therefore, in this case, the stress exerting on the solder layer 115 in the direction of its thickness coincides with a tensile direction, thereby, there results in that when the solder layer 115 is solidified its bonding strength decreases, or that defects tend to arise in the solder layer, thus in consequence decreasing the shear strength of the solder layer itself.

By way of example, if its deformation amount can be minimized in the above case it will be possible to reduce the tensile stress applied on the solder layer thereby to improve its bonding strength, however, even in this case, it is extremely difficult to obtain such an excellent bonding strength which has been attained using the composite plates 123 or 124 having a flattened bottom surface which are arranged such that an appropriate compression stress may be applied according to the invention.

However, even in the above-mentioned example of the invention where the compression stress is allowed to remain in the solder layer, it is desirable for the value of the deformation amount $dX_2$ to be controlled to a minimum requisite.

It is because that if the deformation amount $dX_2$ is controlled to the minimum requisite, such stresses to be applied, at the time of the subsequent assembling into a module, on the solder layers 112 and 121, and on the Si semiconductor chip which have been bonded beforehand can be reduced further, consequently improving the lifetimes of the solders at their bonding portions, and preventing the occurrence of cracks at the Si semiconductor chip. In addition, easier setting of other components and parts at the time of assembly will be further facilitated.

Preferably for minimizing this deformation amount, there are contemplated such methods according to the invention as that which utilizes as its heat dissipation plate 114 a Cu alloy having a larger Young's modulus in place of Cu, or that which provides a groove in the heat dissipation plate 114 by machining so as to absorb the deformation.

In the case where Cu alloys are employed, taking into account a desirable electric conductivity and a thermal resistivity, a 1%Cr—Cu alloy, a 1%Cr-0.1%Zr—Cu alloy, a 0.2%Ag—Cu alloy or the like can be preferably selected.

Figure 33A:
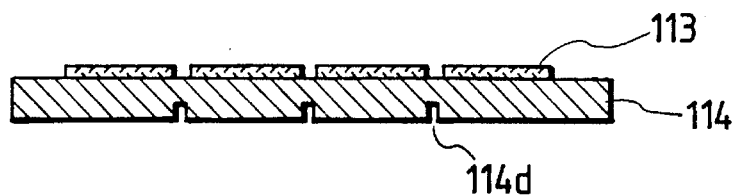
FIGS. 33(a) and 33(b) are diagrams indicative of groove cutting in the bottom surface of the composite plate of one example of the invention.
Figure 33B:
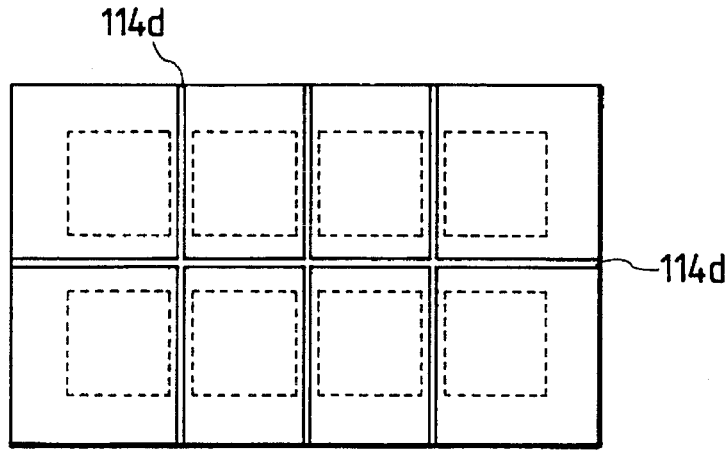
Figure 34A:
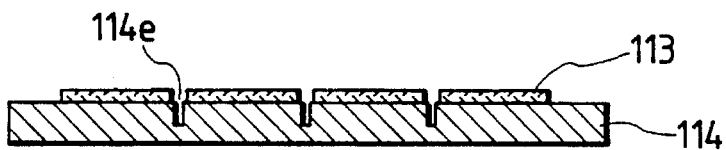
FIGS. 34(a) and 34(b) are diagrams indicative of groove cutting in the upper surface of the composite plate of another example of the invention.
Figure 34B:
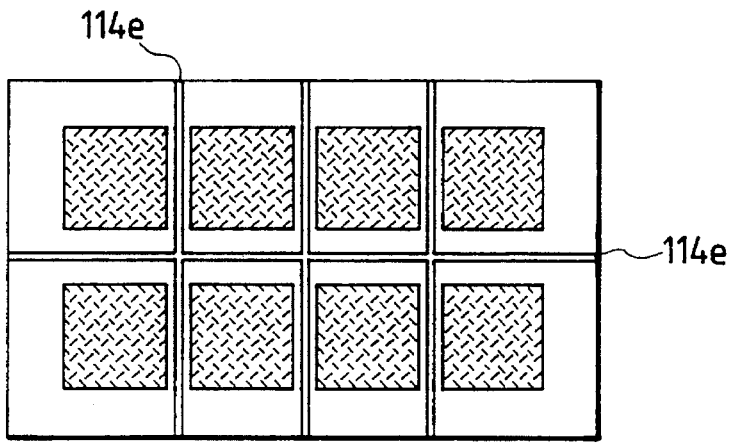

In the case where groove machining is employed, there are available such methods as shown in FIGS. 33(a), (b) each indicative of forming a plurality of grooves 114d in the bottom surface of a heat dissipation plate 114, or in FIGS. 34(a), (b) each indicative of forming a plurality of grooves 114e in the upper surface of the heat dissipation plate 114 going around Mo parts disposed thereon. Either cases can afford sufficient absorption of the deformation. By way of example, (a) in FIG. 33 is a side cross-sectional view and (b) is a bottom view while (a) in FIG. 34 is a side sectional view and (b) is a top view.

By way of example, these grooves 114d and 114e may be arranged to have any appropriate shapes, dimensions, and the number thereof in dependence on a thickness, quantity and arrangement of Mo stress buffer plates to be bonded. However, it is not always necessary to provide grooves all over the peripheral portions of Mo stress buffer plates 113 as shown in the drawing.

Still another embodiment of the invention will be described in the following.

Figure 35A:
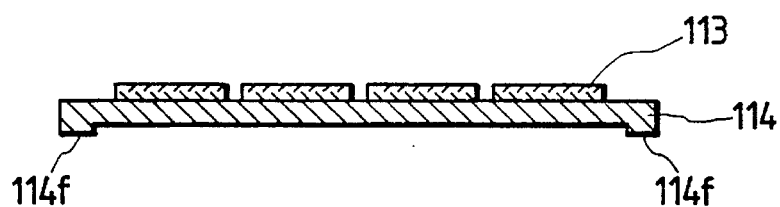
FIGS. 35(a) and 35(b) are diagrams indicative of projection forming on the composite plate according to one example of the invention.
Figure 35B:
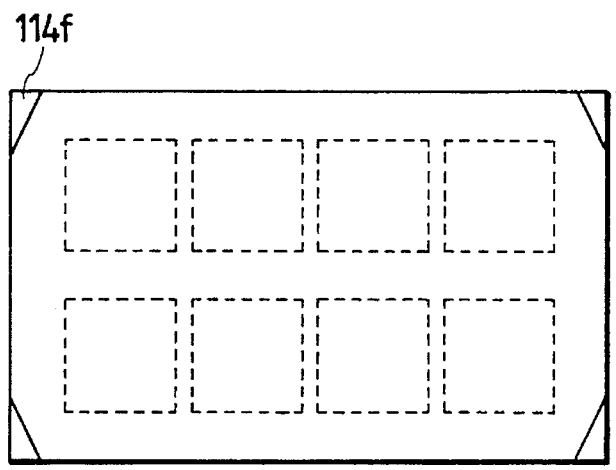

This another embodiment of the invention to be described below has been contemplated in order to prescribe an appropriate thickness of metallic brazing material such as solder to be maintained during bonding so as to suppress a dispersion in the thickness of a solder layer, in consequence, prevent any increase in the stress due to a locally reduced thickness of the solder layer, thereby, provide a stable lifetime to the module. An example of the another embodiment of the invention shown in FIG. 35 is provided by machining the bottom surface of a heat dissipation plate 114 where a solder layer 115 is to be bonded such that a plurality of projections 114f are left thereon which ensure that after a solder layer 115 was fused and solidified during bonding, an appropriate thickness of the solder layer 115 is prevented from decreasing so as to maintain its prescribed set value. By way of example, (a) in FIG. 35 is a side cross-sectional view, and (b) is a bottom view.

These projections 114f are disposed only on positions corresponding to the above-mentioned Cu portion so that thicknesses of the solder and the Cu heat dissipation plate 114 corresponding to the Mo portion which are most susceptible to the lifetime of the module may not be varied, thereby, only the dispersion in lifetime of the solder layer can be reduced selectively and efficiently.

Further, in this example described above, machining of the Cu heat dissipation plate 114 is done by milling the bottom surface into a circular shape by changing its milling depth while machining so as to form projections 114f, thereby, the projections 114f are allowed to have a round corner on the surface thereof to reduce the steps in machining. It is, however, not limited to this surface shape alone, but any surface shapes of projections as long as there are provided at least 4 projections on the corners of the bottom surface of the heat dissipation plate 114 should be construed to provide the same advantage and effect of the invention. It is, however, advantageous to reduce the surface area of these projections as small as possible since a thickness of the solder layer in the portion where a projection is present is decreased.

Figure 36A:
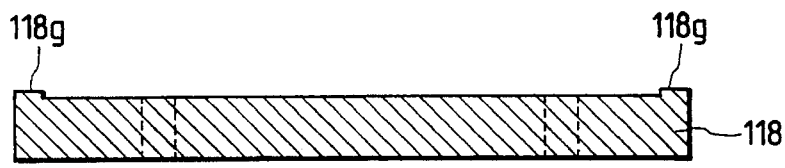
FIGS. 36(a) and 36(b) are diagrams indicative of projection forming on the module support substrate according to one example of the invention.
Figure 36B:
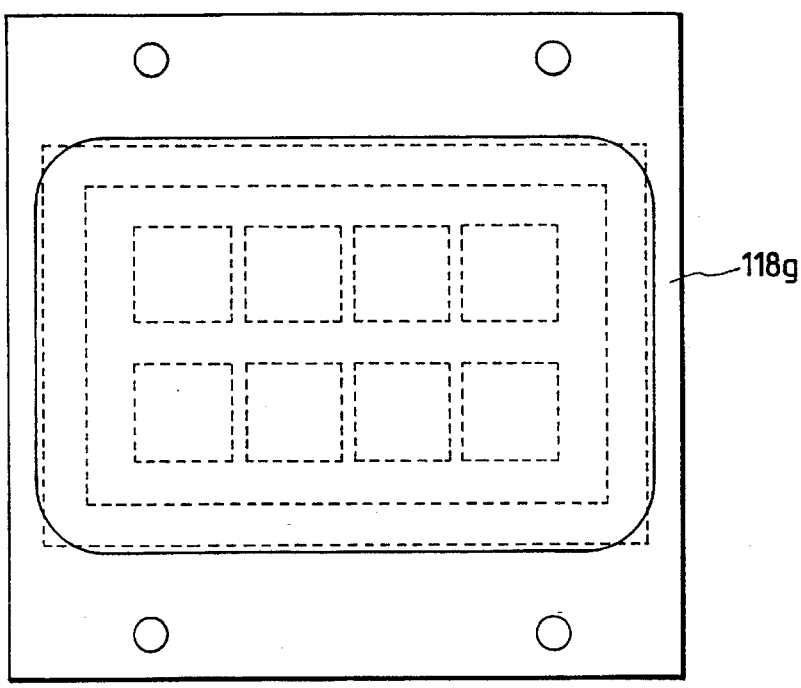

Next, with reference to FIG. 36 there is shown another example of the foregoing embodiment of the invention to ensure an appropriate thickness for the solder layer 115 to be provided on the surface of a module support substrate 118 by machining the same so as to leave the projections 118g. In the drawing of FIG. 36, (a) is a side cross-sectional view, and (b) is a top view.

In this example described above, the positions of the projections 118g are arranged to coincide with the AO portion so that the thicknesses of the solder layer and the Cu heat dissipation plate corresponding to the Cu portion and the Mo portion will not vary, thereby, a local dispersion of lifetime in the solder layer can be selectively and efficiently reduced.

Further, in this example described above, the module support substrate 118 has been machined on both the upper surface and the bottom surface thereof.

Therefore, according to this example described above, various residual stresses accumulated in this module support substrate 118 due to rolling, pressing and the like processing applied thereto from its raw material to its final product can be removed, thereby, eventually it becomes possible to provide a uniform physical property throughout the module support substrate 118, thus, further reducing the dispersion of lifetime in the solder.

By way of example, with respect to the various embodiments of the invention described hereinabove, molybdenum was used as the stress buffer plate, and alumina was used as the insulation plate, however, they are not limited thereto, but tungsten (W) having a better thermal conductivity than molybdenum may be used as the stress buffer plate, and nitride alumina (AlN) having a thermal expansion coefficient nearly the same as that of silicon may be used as the insulation plate to attain the same advantages and effect of the invention without causing any problem, thereby, most appropriate materials may be selected from a group cited above in dependency on a particular shape of the module and an object of use or its application, and their thickness may be optimized accordingly.

As hereinabove described there are such advantages implemented according to the invention that the amount of warp taking place in the metallic heat dissipation plate during bonding can be minimized, and thereby that the cracks and gaps in the brazing solders due to heat cycles during operation can be suppressed to arise. Thereby, it is possible to provide a semiconductor device which features a substantially improved reliability and a longlife.

Further, there is another advantage according to the invention that since each component used in the module continuously in contact with other components via metallic brazing fillers like solder is adapted to have a different local thickness in its structure so as to provide a different local cross section which serves to minimize a stress exerting on each portion of the solder layer.

Further, there is still another advantage according to the invention that since the bottom surface of the composite plate prepared by bonding the stress buffer plate and the heat dissipation plate was machined to a flat surface, an appropriate compression stress can be applied to the bonding filler during bonding of the composite plate.

There is still further advantage according to the invention that the projections formed on the bottom surface of the heat dissipation plate or on the upper surface of the module support substrate on which the solder is to be bonded ensure a space for the solder layer to retain an appropriate thickness, thereby to prolong the lifetime of the module.

What is claimed is:

1. A semiconductor device produced by sequentially mounting on a metallic support plate an insulation substrate, a metallic heat dissipation plate, a plurality of thermal stress relieving material disposed on said metallic heat dissipation plate, and a plurality of semiconductor elements disposed respectively on said plurality of thermal stress relieving material, wherein said metallic heat dissipation plate comprises a copper based alloy of which a softening temperature at which a hot hardness thereof becomes ½ of a hardness at a room temperature exceeds a highest temperature required for bonding each of said insulation substrate, said metallic heat dissipation plate, said plurality of thermal stress relieving material and said plurality of semiconductor elements.

2. A semiconductor device produced by sequentially mounting on a metallic support plate an insulation substrate, a metallic heat dissipation plate, a plurality of thermal stress relieving material disposed on said metallic heat dissipation plate, and a plurality of semiconductor elements disposed respectively on said plurality of thermal stress relieving material, wherein said metallic support plate comprises a copper based alloy of which a softening temperature at which a hot hardness thereof becomes ½ of a hardness at a room temperature exceeds a bonding temperature required for bonding to said metallic heat dissipation plate.

3. A semiconductor device produced by sequentially mounting on a metallic support plate an insulation substrate, a metallic heat dissipation plate, a plurality of thermal stress relieving material disposed on said metallic heat dissipation plate, and a plurality of semiconductor elements disposed respectively on said plurality of thermal stress relieving material, wherein at least one of said metallic heat dissipation plate and said metallic support plate comprises a copper based alloy of which a softening temperature at which a hot hardness thereof becomes ½ of a hardness at a room temperature exceeds a highest temperature required for bonding each of said insulation substrate, said metallic heat dissipation plate, said plurality of thermal stress relieving material and said plurality of semiconductor elements, and further, of which a thermal conductivity at room temperature is 320 J/sec.m.K or more, or of which an electric conductivity at room temperature is 50% or more in terms of International Annealed Copper Standard (IACS).

4. A semiconductor device produced by sequentially mounting on a metallic support plate an insulation substrate, a metallic heat dissipation plate, a plurality of thermal stress relieving material disposed on said metallic heat dissipation plate, and a plurality of semiconductor elements disposed respectively on said plurality of thermal stress relieving material, wherein at least one of said metallic heat dissipation plate and said metallic support plate comprises a metal of which a softening temperature at which a hot hardness thereof becomes ½ of a hardness at a room temperature is above a highest temperature required for bonding each of said insulation substrate, said metallic heat dissipation plate, said plurality of thermal stress relieving material and said plurality of semiconductor elements, further, of which a thermal conductivity at room temperature is 320 J/sec.m.K or more, or of which an electric conductivity at room temperature is 50% or more in terms of IACS, and further, of which an elastic constant at room temperature is 130 GPa or more.

5. A semiconductor device produced by sequentially mounting on a metallic support plate an insulation substrate, a metallic heat dissipation plate, a plurality of thermal stress relieving material disposed on said metallic heat dissipation plate, and a plurality of semiconductor elements disposed respectively on said plurality of thermal stress relieving material, wherein at least one of said metallic heat dissipation plate and said metallic support plate comprises a copper based alloy of which a thermal conductivity at room temperature is 320 J/sec.m.K or more, or of which an electric conductivity at room temperature is 50% or more in terms of IACS, and further, of which an elastic constant at room temperature is 130 GPa or more.

6. A semiconductor device produced by sequentially mounting on a metallic support plate an insulation substrate, a metallic heat dissipation plate, a plurality of thermal stress relieving material disposed on said metallic heat dissipation plate, and a plurality of semiconductor elements disposed respectively on said plurality of thermal stress relieving material, wherein at least one of said metallic heat dissipation plate and said metallic support plate comprises a copper based alloy which contains at least one of Cr, Zr, Ti, Be, Sn, Ag and Cd, and of which a softening temperature at which a hot hardness thereof becomes ½ of a hardness at room temperature is 350° C. or more, further, of which a thermal conductivity at room temperature is 320 J/sec.m.K or more, or of which an electric conductivity at room temperature is 50% or more in terms of IACS, and further, of which an elastic constant at room temperature is 130 GPa or more.

7. A semiconductor device produced by sequentially mounting on a metallic support plate an insulation substrate, a metallic heat dissipation plate, a plurality of thermal stress relieving material parts disposed on said metallic heat dissipation plate, and a plurality of semiconductor elements disposed respectively on said plurality of thermal stress relieving material, wherein at least one of said metallic heat dissipation plate and said metallic support plate comprises a copper based alloy which contains copper and another metal element in an amount in excess of a solid solution limit relative to said copper, said copper based alloy being subjected to age hardening treatment, of which a softening temperature at which a hot hardness thereof becomes ½ of a hardness at room temperatures is 350° C. or more, and further, of which a thermal conductivity at room temperatures is 320 J/sec.m.K or more, or of which an electric conductivity at room temperatures is 50% or more in terms of IACS.

8. A semiconductor device produced by sequentially mounting on a metallic support plate an insulation substrate, a metallic heat dissipation plate, a plurality of thermal stress relieving material disposed on said metallic heat dissipation plate, and a plurality of semiconductor elements disposed respectively on said plurality of thermal stress relieving material, wherein at least one of said metallic heat dissipation plate and said metallic support plate comprises a copper based alloy which contains copper in 98.7% or more in weight ratio and at least one element selected from the group of Cr, Zr, Ag and Sn in the remaining percent in weight ratio, and of which a softening temperature at which a hot hardness thereof becomes ½ of a hardness at room temperatures is 350° C. or more.

9. A semiconductor device produced by sequentially mounting on a metallic support plate an insulation substrate, a metallic heat dissipation plate, a plurality of thermal stress relieving material disposed on said metallic heat dissipation plate, and a plurality of semiconductor elements disposed respectively on said plurality of thermal stress relieving material, wherein at least one of said metallic heat dissipation plate and said metallic support plate comprises a copper based alloy which contains copper in 98.7% or more in weight ratio and at least one element selected from the group of Cr, Zr, Ag and Sn in the remaining percent in weight ratio, and of which a thermal conductivity at the room temperature is 320 J/sec.m.K or more, or of which an electric conductivity at the room temperature is 50% or more in terms of IACS.

10. A semiconductor device produced by mounting on a metallic support plate an insulation substrate provided with a Cu foil electrode on both surfaces thereof, and a plurality of semiconductor elements, wherein said metallic support plate comprises a material of which a softening temperature at which a hot hardness thereof becomes ½ of a hardness at the room temperature exceeds a bonding temperature required for bonding said metallic support plate, and of which a thermal conductivity at the room temperature is 320 J/sec.m.K or more, or of which an electric conductivity at the room temperature is 50% or more in terms of IACS.

11. A semiconductor device produced by mounting on a metallic support plate an insulation substrate provided with a Cu foil electrode on both surfaces thereof, and a plurality of semiconductor elements, wherein said metallic support plate comprises a copper alloy which contains copper in 98.7% or more in weight ratio and at least one element selected from the group of Cr, Zr, Ag and Sn in a range up to 1.1% in total, either singularly or combined, in the remaining percent in weight ratio, and further, of which a thermal conductivity at the room temperature is 320 J/sec.m.K or more, or of which an electric conductivity at the room temperature is 50% or more in terms of IACS.

12. A semiconductor device produced by sequentially mounting on a metallic support plate an insulation substrate, a metallic heat dissipation plate, a plurality of thermal stress relieving material disposed on said metallic heat dissipation plate, and a plurality of semiconductor elements disposed respectively on said plurality of thermal stress relieving material, wherein at least one of said metallic heat dissipation plate and said metallic support plate comprises a copper based alloy of which a softening temperature at which a hot hardness thereof becomes ½ of a hardness at the room temperature is 350° C. or more, and of which a thermal conductivity at the room temperature is 320 J/sec.m.K or more, or of which an electric conductivity at the room temperature is 50% or more in terms of IACS, and further wherein a bonding layer for bonding between said insulation plate and said metallic heat dissipation plate or said metallic support plate comprises either one of a mesh or a sheet in mesh form disposed therein, of which a thermal expansion coefficient has an intermediate value between those of respective members to be bonded.

13. A semiconductor device according to either claims 1 or 12 wherein said plurality of thermal stress relieving material disposed between said plurality of semiconductor elements and said metallic heat dissipation plate comprise one selected from the group of Mo, W and Ta, or an alloy thereof.

14. A semiconductor device according to either claims 1 or 12 wherein said insulation substrate comprises one selected from the group of $Al_2O_3$, AlN and SiC.

15. A semiconductor device having the metallic support plate and the metallic heat dissipation plate according to either claims 1 or 9, and sequentially bonding the insulation substrate, the metallic heat dissipation plate, the thermal stress relieving material and the semiconductor elements using an appropriate brazing filler, wherein the semiconductor device comprises a composite body prepared by bonding said thermal stress relieving material and said metallic heat dissipation plate, and wherein a warp caused in said metallic heat dissipation plate during bonding is machined to provide a flat surface, said metallic heat dissipation plate having the flat surface being bonded to said insulation substrate and said metallic support plate.

16. A semiconductor device having the metallic support plate and the metallic heat dissipation plate according to either claims 1 or 9, and sequentially bonding on the metallic support plate an insulation substrate, the metallic heat dissipation plate, thermal stress relieving materials and semiconductor elements using brazing fillers, wherein said metallic heat dissipation plate comprises a groove formed at least in one surface thereof toward either said thermal stress relieving material or said insulation substrate.

17. A semiconductor device having the metallic support plate and the metallic heat dissipation plate according to either claims 1 or 9, and sequentially bonding on the metallic support plate an insulation substrate, the metallic heat dissipation plate, thermal stress relieving materials and the semiconductor elements using brazing fillers, wherein said heat dissipation plate comprises a tapered end.

18. A semiconductor device having an internal insulation for ensuring insulation between its semiconductor elements and its electrically conductive support substrate by arranging such that the semiconductor elements are bonded using a metallic brazing filler over the electrically conductive support substrate via a plurality of electrically conductive plates and an insulating plate, each having a different size, wherein at least one of said electrically conductive plates and said electrically conductive support substrate comprises at least a portion in the periphery thereof the thickness of which is reduced relative to a thickness at the center portion thereof by machining one surface thereof which is in contact with another plate of a smaller size.

19. A semiconductor device according to claim 18 wherein said machining is selected from counterboring, groove-cutting, and slit-forming.

20. A semiconductor device according to claim 18 wherein said machining includes an oblique cutting to provide a curved oblique surface or a flat oblique surface.

21. A semiconductor device according to any one of claims 1 to 12, arranged such that at least one of said semiconductor elements is bonded over a support substrate made of one of copper and a copper alloy via a thermal stress buffer plate made of Mo, W, Ta or its alloy disposed corresponding to the at least one semiconductor element, a heat dissipation plate made of one of copper and a copper alloy, and an insulation plate made of one of $Al_2O_3$, AlN and SiC, each of which is laminated sequentially, beginning with said insulation plate, on the support substrate, wherein said heat dissipation plate comprises a portion in the periphery thereof the thickness of which is less than a thickness at a relatively central portion thereof.

22. A semiconductor device according to claim 21, wherein said portion in the periphery thereof, having the reduced thickness, comprises a curved surface or a flat surface formed by oblique cutting.

23. A semiconductor device according to any one of claims 1 to 12, arranged such that at least one of said semiconductor elements is bonded over a support substrate made of one of copper and a copper alloy via a thermal stress buffer plate made of Mo, W, Ta or its alloy disposed corresponding to the at least one semiconductor element, a heat dissipation plate made of one of copper and a copper alloy, and an insulation plate made of one of $Al_2O_3$, AlN and SiC, each of which is laminated sequentially, beginning with said insulation plate, on the support substrate, wherein said heat dissipation plate comprises a portion in the periphery thereof the thickness of which is less than a thickness at a relatively central portion thereof which has on one surface thereof said thermal stress buffer plate lamination-bonded.

24. A semiconductor device according to claim 23, wherein said portion in the periphery thereof, having a reduced thickness, comprises being formed at least by one of the processing methods of oblique cutting, groove cutting and counterboring.

25. A semiconductor device according to any one of claims 1 to 12, arranged such that at least one of said semiconductor elements is bonded over a support substrate made of one of copper and a copper alloy via a thermal stress buffer plate made of Mo, W, Ta or its alloy disposed corresponding to the at least one semiconductor element, a heat dissipation plate made of one of copper and a copper alloy, and an insulation plate made of one of $Al_2O_3$, AlN and SiC, each of which is laminated sequentially, beginning with said insulation plate, on the support substrate, wherein at least one of said heat dissipation plate and said support substrate comprises a plurality of protrusions having a predetermined height and size formed at least on one surface thereof on which said insulation substrate is bonded.

26. A semiconductor device according to any of claims 1 to 12 and 18 to 20 wherein said semiconductor elements include at least one type of semiconductor elements selected from the group of insulated gate bipolar transistors (IGBT), diodes and thyristors.

27. An electric power control apparatus comprising the semiconductor device according to claim 26.

28. A vehicle including a train and electric car comprising the electric power control apparatus according to claim 26.

29. An elevator control apparatus comprising the electric power control apparatus according to claim 26.

30. A machine tool comprising the electric power control apparatus according to claim 26.

31. A metallic support plate for mounting semiconductor elements, wherein the metallic support plate comprises a copper alloy of which a softening temperature at which a hot hardness thereof becomes ½ of a hardness at the room temperature is 350° C. or more, and of which a thermal conductivity at the room temperature is 320 J/sec.m.K or more, or of which an electric conductivity at the room temperature is 50% or more in respect of IACS.

32. A metal heat dissipation plate for mounting semiconductor elements wherein the metal heat dissipation plate comprises a copper alloy of which a softening temperature at which a hot hardness thereof becomes ½ of a hardness at the room temperature is 350° C. or more, and of which a thermal conductivity at the room temperature is 320 J/sec.m.K or more, or of which an electric conductivity at the room temperature is 50% or more in respect of IACS.

\* \* \* \* \*